United States Patent [19]

Kato et al.

[11] Patent Number: 5,420,822
[45] Date of Patent: May 30, 1995

[54] NON-VOLATILE SEMICONDUCTOR MEMORY DEVICE

[75] Inventors: Hideo Kato, Kawasaki; Nobutake Sugiura; Kiyotaka Uchigane, both of Yokohama; Masamichi Asano, Tokyo, all of Japan

[73] Assignee: Kabushiki Kaisha Toshiba, Kawasaki, Japan

[21] Appl. No.: 218,629

[22] Filed: Mar. 28, 1994

Related U.S. Application Data

[63] Continuation of Ser. No. 41,240, Mar. 31, 1993, abandoned.

[30] Foreign Application Priority Data

Mar. 31, 1992 [JP] Japan ............................ 4-077523
Mar. 31, 1992 [JP] Japan ............................ 4-077775
Nov. 5, 1992 [JP] Japan ............................ 4-295469

[51] Int. Cl.$^6$ .............................................. G11C 7/00
[52] U.S. Cl. ................................... 365/218; 365/200; 365/201; 365/210; 365/189.07; 365/189.09
[58] Field of Search .............. 365/210, 200, 201, 218, 365/189.01, 189.07, 189.09

[56] References Cited

U.S. PATENT DOCUMENTS

| | | | |
|---|---|---|---|
| 4,641,284 | 2/1987 | Suzuki | 365/210 |
| 4,841,482 | 6/1989 | Kreifels et al. | |
| 4,860,261 | 8/1989 | Kreifels et al. | |
| 4,905,194 | 2/1990 | Ohtsuka et al. | 365/201 |
| 4,982,364 | 1/1991 | Iwahashi | 365/210 |
| 5,142,496 | 8/1992 | Van Buskirk | 365/210 |
| 5,157,626 | 10/1992 | Watanabe | 365/210 |
| 5,197,028 | 3/1993 | Nakai | 365/210 |
| 5,214,604 | 5/1993 | Kato | 365/201 |
| 5,241,507 | 8/1993 | Fong | 365/218 |
| 5,297,079 | 3/1994 | Ha | 365/210 |

FOREIGN PATENT DOCUMENTS 2-137196(A) 5/1990 Japan.
3-156798(A) 7/1991 Japan.

*Primary Examiner*—Joseph A. Popek
*Assistant Examiner*—Tan Nguyen
*Attorney, Agent, or Firm*—Foley & Lardner

[57] ABSTRACT

When an erase voltage is applied to the sources of data erasable and rewritable memory cells each having a floating gate, the erasure characteristics of the memory cells can be improved by controlling the rise time of the erase voltage or by increasing the erase voltage stepwise. In test mode, no row lines are selected by a row decoder and further the sources of the respective memory cells are set to ground level. Under these conditions, in case there exists an overerased memory cell, this cell is turned on due to depletion, so that it is possible to detect the presence of the overerased memory cell on the basis of change in potential of the column line connected to this turned on memory cell. A differential amplifier is used to detect the change in potential of the column line. In the test mode, the potential of the column lines is compared with a reference potential applied to a dummy column line, and a source bias generating circuit applies a test potential suitable for test to the respective sources of the cells, to shift the threshold level of the respective cells in a positive direction, for instance. By applying this test potential to the cells, it is possible to detect the pseudo-threshold level shifted in the positive direction; that is, to detect the overerased status of the memory cell more properly.

51 Claims, 31 Drawing Sheets

|  | BSL | BL | WL | VSS |
|---|---|---|---|---|
| ERASE | 0 V | FLOATING | 20 V | 0 V |
| WRITE "0" WRITE | 22 V | 0 V | 0 V | FLOATING |
| "1" WRITE | 22 V | 20 V | 0 V | FLOATING |
| NON-SEL CELLS | 22 V | 0V/20V | 10 V | FLOATING |
| READ | 5 V | 0V/5V | 5 V | 0 V |

FIG. 35

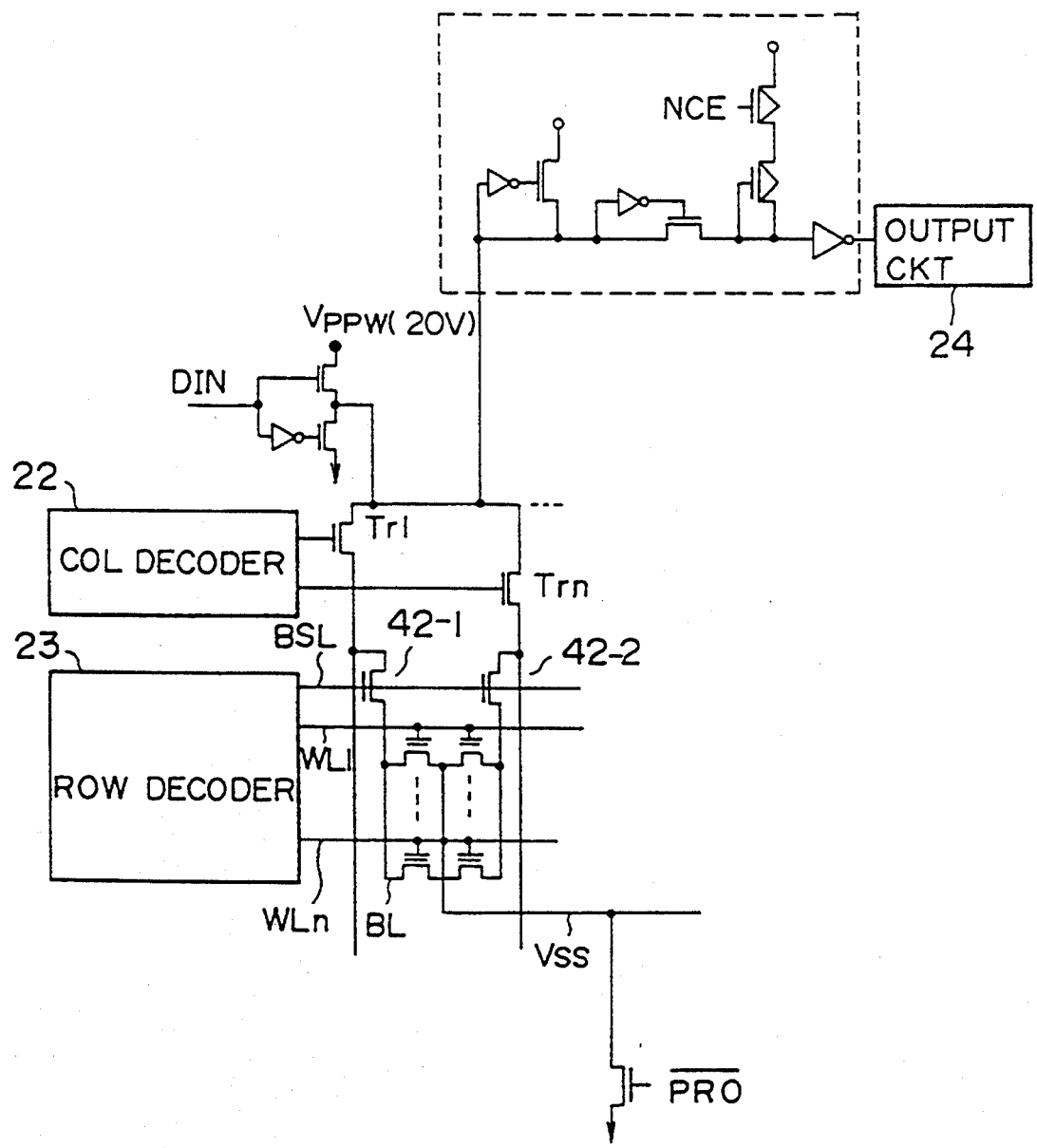
F I G. 36

NON-VOLATILE SEMICONDUCTOR MEMORY DEVICE

This application is a continuation of application Ser. No. 08/041,240, filed Mar. 31, 1993, now abandoned.

FIELD OF THE INVENTION

The present invention-relates to a non-volatile semiconductor memory device, and more specifically to an electrically data rewritable non-volatile semiconductor memory device excellent in the data erasure characteristics, easy to test the overerasure status, and high in access speed.

BACKGROUND OF THE INVENT I ON

An EEPROM (Electrically Erasable and Programmable Read Only Memory) which can electrically erase stored data and further rewrite new data therein has been widely used more and more for control apparatuses or as IC cards (memory cards ), because data can be erased easily in response to electric signals under the condition that the EEPROM is kept mounted or assembled on a board.

A memory cell structure as shown in FIGS. 1 to 4 has been so far known as the EEPROM suitable for a large capacity. FIG. 1 is a plan view showing a pattern of the memory cell; FIG. 2 is a cross-sectional view taken along the line A—A′ in FIG. 1; FIG. 3 is a cross-sectional view taken along the line B—B′ in FIG. 1; and FIG. 4 is an equivalent circuit thereof.

As depicted in these drawings, a gate oxide film 18 with a thickness of about 100 angstrom is formed on a region enclosed by a field oxide film 20 formed on a P type substrate 13. A floating gate 11 of a first poly silicon layer is formed via the gate oxide film 18. Further, a control gate 12 of a second poly silicon layer is formed on the floating gate 11 via an insulating film 19. The insulating film 19 is of three-layer structure, for instance such as O—N—O (oxide-Nitride-Oxide). The thickness of the insulating film 19 is about 200 angstrom in oxide film conversion. The control gate 12 is used as a word line of the memory cell. Further, another insulating layer 21 is formed on the control gate 12.

In addition, a source 14 and a drain 15 formed of an N+ type diffusion layer are formed on the P type substrate 13 and on both the sides of the floating gate 11 and the control gate 12. A contact hole 16 is formed open in the insulating layer 21 at such a position as to correspond to the drain 15. Further, a data line 17 of an aluminum layer is connected to the drain 15 through the contact hole 16.

The memory cell constructed as described above can realize the function corresponding to an equivalent circuit as shown in FIG. 4, in which D denotes the drain 15; S denotes the source 14; and CG denotes the control gate 12, respectively.

The operation of the memory cell thus constructed will be described hereinbelow.

To erase date, an erase voltage of 12 volts, for instance is applied to the source 14 with the drain kept floated. Further, the control gate 12 is set to 0 volts. Under these conditions, a relatively high erase voltage is applied between the floating gate 11 and the source 14 via the thin gate oxide film 18. Electrons in the floating gate 11 are emitted into the source 14 on the basis of Fowler-Nordheim tunnel effect, with the result that data is erased.

To write data, on the other hand, a voltage of about 6 volts is applied to the drain 15; a voltage of 0 volts is applied to the source 14; and a voltage of 12 volts is applied to the control gate 12. As a result, impact ionization occurs in the vicinity of the drain 15, so that electrons are injected into the floating gate 11 to write data therein.

Further, to read data, a voltage of 1 volt is applied to the drain 15; a voltage of 0 volts is applied to the source 14; and a voltage of 5 volts is applied to the control gate 12. Therefore, it is possible to obtain data "0" or data "1" on the basis of the presence or absence of electrons in the floating gate 11.

FIG. 5 shows a circuit configuration of the conventional semiconductor memory device using the memory cells constructed as described above, in which a flash type 8-bit EEPROM of byte structure is shown in particular by way of example.

in FIG. 5, the memory cells are arranged in a matrix pattern of m-rows and n-columns. The sources of these memory cells 30 are all connected in common to a terminal SS. The control gates of these memory cells 30 are connected to the row lines WL1 to WLm, respectively for each row. The drains of these memory cells 30 are connected to the column lines DL1 to DLn, respectively for each column.

Further, the terminal SS is connected to a source voltage control circuit 37, to which a high supply voltage is supplied through an external high voltage supply terminal Vpp. The row lines WL1 to WLm are connected to a row decoder 31. The column lines DL1 to DLn are connected to common junction points N-1 to N-8 via enhancement type column select transistors 33-1 to 33-n, respectively. Outputs of a column decoder 32 are applied to the gates of the column select transistors 33-1 to 33-n through column select lines CL1 to CLn, respectively.

Data writing enhancement type load transistors 34-1 to 34-8 are connected between the common junction points N-1 to N-8 and the external high voltage supply terminal Vpp, respectively. Written data Din*1 to Din*8 are inputted to written data control circuits 35-1 to 35-8 through external terminals, respectively. The inverted written data /Din*1 to /Din*8 (/D denotes an inversion signal of D) are inputted from the written data control circuits 35-1 to 35-8 to the gates of these load transistors 34-1 to 34-8, respectively.

Further, an output SW of a high voltage switching circuit 36 is supplied to the row decoder 31 and the column decoder 32. A high voltage is supplied to this switching circuit 36 through the external high supply voltage terminal Vpp.

Further, data reading sense amplifiers 38-1 to 38-8 including a load transistor, respectively are connected to the common junction points N-1 to N-8. Output circuits 39-1 to 39-8 for outputting data to the external terminals are connected to these sense amplifiers 38-1 to 38-8, respectively.

In a source voltage control circuit 37, an erase signal Erase is inputted to the gates of series-connected P type transistor 37A and N type transistor 37B, respectively. The output of the common-connected drains of these P and N type transistors 37A and 37B is inputted to the gates of series-connected P type transistor 37D and N type transistor 37E through the source and drain of an N type transistor 37C, respectively. The common-connected drains of these P and N type transistors 37D and 37E are connected to the terminal SS and also to the gate of the P type transistor 37F. The drain of the P type transistor 37F is connected to the gates of the P and N type transistors 37D and 37E, respectively. The source of the P type transistor 37A and the gate of the N type transistor 37C are connected to the supply voltage Vcc, respectively. The sources of the P type transistor 37F and the P type transistor 37D are connected to the external high supply voltage terminal Vpp.

The operation of the circuit configured as described above will be described hereinbelow.

To write data, a voltage of 12 volts is supplied to the external high supply voltage terminal Vpp. Upon application of 12 volts to the external high supply voltage terminal Vpp, the high voltage switching circuit 36 outputs 12 volts to the column decoder 32 and the row decoder 31 as the output SW, respectively. At the same time, one memory cell 30 for each output bit; that is, a sum total of 8 memory cells 30 for 8 output bits are selected on the basis of the column select lines CL1 to CLn and the row lines WL1 to WLm selected in response to address signals, respectively.

Here, the assumption is made that a voltage of 12 volts is applied to the selected line (e.g., WL1) of the row lines WL1 to WLm and another voltage of 12 volts is applied to the selected line (e.g., CL1) of the column select lines CL1 to CLn.

Here, when the written data Din*1 to Din*8 are at "0", the written data control circuits 35-1 to 35-8 (to which a high voltage is applied from the external high supply voltage terminal Vpp, respectively) output voltages of about 9 volts as the written data/Din*1 to Din*8, respectively, so that the load transistors 34-1 to 34-8 are turned on, respectively. Accordingly, a voltage of about 6 volts is applied from the external high supply voltage terminal Vpp to the selected lines of the column lines DL1 to DLn via the load transistors 34-1 to 34-8 and the column select transistors 33-1 to 33-n, in order to write data in the corresponding memory cells 30. On the other hand, when the written data Din*1 to Din*8 are at "1", since the written data/Din*1 to/Din*8 are at "0", the load transistors 34-1 to 34-8 are all turned off, so that no voltage is applied to the drains of the selected memory cells 30 without writing data therein.

To erase data, a high voltage of about 12 volts is supplied from the external high supply voltage terminal Vpp to the terminal SS via the source voltage control circuit 37, in order to set all the column select lines CL1 to CLn and the row lines WL1 to WLm to "0" volts, so that all the memory cells are erased simultaneously.

Further, in this case, the erasure is made by applying an erase signal Erase to the source voltage control circuit 37. However, in response to the erase signal Erase, the P type transistor 37A is turned off and the N type transistor 37B is turned on. Therefore, the P type transistor 37D is turned on through the N type transistor 37C and simultaneously the N type transistor 37E is turned off, so that the external high supply voltage Vpp is outputted to the terminal SS. At the same time, the external high supply voltage Vpp is applied to the gate of the P type transistor 37F to turn off the P type transistor 37F.

Further, to read data, the data writing load transistors 34-1 to 34-8 are always tuned off, and the output SW of the high voltage switching circuit 36 is set to Vcc (5 volts). The data "1" or "0" of the memory cells 30 selected by the column decoder 32 and the row decoder 31 are sensed and amplified by the sense amplifies 38-1 to 38-8, and then outputted to the external output terminals via the output circuits 39-1 to 39-8, respectively.

As described above, in the conventional semiconductor memory device, since the external high supply voltage Vpp is applied to the device through the source voltage control circuit 37 when data are erased, the following problems arise:

FIGS. 6A to 6C are waveform diagrams for assistance in explaining the data erasure operation, in which FIG. 6A shows the waveform of a voltage outputted from the terminal SS in response to the erase signal Erase; FIG. 6B shows the tunnel current characteristics of when a bias voltage is applied to the sources of the respective transistors of the memory cells 30; and FIG. 6C shows the load characteristics of the P type transistor 37D of the source voltage control circuit 37, respectively.

As shown in FIG. 6A, when the erase signal Erase changes to "1" in the data erasure mode, the high voltage supplied from the source voltage control circuit 37 to the terminal SS rises sharply up to 12 volts. This rise time is as fast as 1 μsec or less.

In the data erasure mode, a voltage of zero volts is applied to the control gates of the memory cells 30 to obtain the floating drains thereof, and further an erase voltage is applied to the sources thereof from the source voltage control circuit 37. In this case, the tunnel current I of the transistor of the memory cell 30 changes according to the source voltage Vs, as shown in FIG. 6B. In more detail, under the condition that electrons are injected into the floating gate of the memory cell 30 and the gate is kept at a negative potential, the tunnel current flows between bands on the basis of the source voltage lower by this negative voltage, as shown by the line T in FIG. 6C. At this time, when a tunnel current i1 ampere flows between bands, electrons are extracted from the floating gate at the intersection Q between the load line R of the P type transistor 37D and the vertical line T.

With the advance of data erasure, the potential at the floating gate rises. Therefore, the current between bands decreases gradually, so that the operating point changes from the point Q to 12 volts along the line P.

In this case, however, before the source voltage reaches 12 volts, if current flows by a cause (e.g., breakdown current) other than the leak current, there exists a problem in that the source voltage will not rise up to 12 volts and therefore the tunnel current also stops.

In other words, in the data erasure, when the source voltage of the memory cell 30 rises sharply, current between bands flows, with the result that the erasure characteristics deteriorate.

Another problem will be described hereinbelow.

As already explained, the erasure of data from the memory cell is achieved by extracting electrons existing in the floating gate 11 to the source side 14 by applying a high voltage of 12 volts to the source 14. That is, tunnel current flows due to an electric field generated between the floating gate 11 and the source 14, so that data is erased.

Therefore, there exists a problem in that the erasure characteristics differ according to dispersion in the electric field. There are various factors of causing the dispersion in the electric field, for instance such as the dispersion of the gate insulating film 18, an overlap length (as shown by $X_{js}$ in FIG. 3) of the floating gate 11 and the source 14, etc. Accordingly, even if a voltage is applied to the source 14 for a predetermined time, since there exist various memory cells of high electric field and memory cells of low electric field, a difference in erasure characteristics occurs between the memory cells, so that there exists a distribution in the erasure status; that is, there exist various cells of high erasure speed and low erasure speed.

FIG. 7 shown the erasure characteristics, in which the abscissa designates the voltage Vg of the control gate 12 and the ordinate designates the current Id of the drain 15. This graph shown in FIG. 7 indicates that there exists a distribution in the thresholds of the memory cells from which data are erased; that is, there exists an erasure distribution between the high erasure speed cells and the low erasure speed cells. Therefore, where the memory cell LSI is erased, if the erasure operation is kept executed until the lowest erasure speed cell can be erased, there exists a problem in that the high erasure speed cell is overerased and thereby the leak current flows under the condition that the voltage Vg of the control gate 12 is kept at 0 volts. Once the overerasure occurs, the threshold voltage of the memory cell becomes negative; the depletion occurs; the cell is turned on and the current flows even if the control gate 12 is at 0 volts, with the result that a leak current inevitably flows.

FIG. 8 is a circuit diagram for assistance in explaining the operation of the memory cell LSI in which an overerased memory cell exists. In FIG. 8, the row decoder 23 determines access to the row lines WL1 to WLm. The column decoder 22 determines access to the column lines BL1 to BLn. A number of memory cells M11 to Mln and Mm1 to Mmn are arranged in a matrix pattern in the vicinity of the intersections between the row lines WL1 to WLm and the column lines BL1 to BLn. Here, the assumption is made that the memory cell Mmn is overerased into depletion status. The data reading sense amplifier SA is connected to the column lines BL1 to BLn.

In the circuit configuration as described above, the assumption is further made that the column decoder 22 selects the column line BLn and the row decoder 23 applies a voltage of 5 V to the row line WL1 and a voltage of 0 V to the row line WLm to select the memory cell Mln in which data "0" is written. Under these conditions, no current flows through the bit line BLn. However, since a leak current I- flows through the non-selected overerased memory cell Mmn, in spite of the fact that the control gate thereof is at 0 V, the sense amplifier SA erroneously read the data in the memory cell Mln as "1". In other words, if an overerased memory cell exists along the selected column lines BL1 to BLn, a leak current flows through the overerased cell, irrespective of the fact that the overerased cell is selected or not by the row lines WL1 to WLn, with the result that the sense amplifier SA always reads "1". Namely, it is impossible to correctly read the data from the memory cells connected to the column lines BL1 to BLn on which an overerased memory cell exists.

Accordingly, it is very important to check whether the memory cells are overerased into depletion status or not, in order to secure the reliability of the operation of the memory cell LSI. In the ordinary EEPROM, it is necessary to guarantee the number of data rewriting operations beyond $10^4$ to $10^5$ times, when the memory cells are used as a memory card. After data have been rewritten repeatedly by the above-mentioned times, since electrons are trapped in the oxide film, the data rewriting characteristics deteriorate gradually. On the other hand, if the data are rewritten by the above-mentioned $10^4$ to $10^5$ times, the test time is excessively long and also meaningless. Therefore, it is very important to determine the margin in the overerasure test.

The conventional methods of testing the overerasure are disclosed in U.S. Pat. Nos. 4,841,482 or 4,860,261, respectively. In these methods, the potential of the word lines is floated about 0.5 V, for instance to get a margin of the test for checking whether the overerasure status occurs or not. In other words, the flow of the leak current is tested under the above-mentioned condition (the word line potential is floated by 0.5 V), in order to obtain a margin of 0.5 V. This is because the non-selected word lines are set to 0 V in the actual data reading operation.

However, the conventional methods involve the following problem: when the memory cell LSIs are manufactured, the threshold levels of the memory cell LSI distribute from 2 V to 3 V in the erasure operation. On the other hand, there exists a close relationship between the threshold level of the erased memory cell and the access time of the same memory cell. When the data is erased down to a lower threshold level, since a large operating current can be obtained in the data read operation, it is possible to operate the cell at a higher speed. Here, the threshold level on which data is determined to be erased is assumed to be 2.5 V, by considering that the threshold level distribution of the memory cells is about 2 V and by anticipating that the margin thereof is 0.5 V. In this case, however, the erasure threshold levels of the acutely manufactured memory cell LSI chips distribute up to about 3 V. Therefore, if an LSI having the 3 V threshold distribution is manufactured and erased at 2.5 V in the erasure test, since a leak current flows, the LSI chip becomes defective. In other words, when the erasure operation is made at a lower threshold voltage, defective chips increase and thereby the manufacturing cost increases. In contrast with this, if the erasure level is set to a higher threshold level under consideration of the high threshold distribution chips, since sufficient operating current cannot be obtained in the data reading operation, thus raising another problem in that the operation speed is low.

As described above, in the conventional semiconductor memory device, since the memory cells cannot be erased at the lower threshold level, the memory cells are not suitable for high speed operation, and further it has been difficult to improve the operation margin.

Further, FIG. 9 shows a circuit for monitoring the threshold level Vth of the conventional LSI chip. In the threshold level (Vth) measuring test mode in FIG. 9, the signal Icell is set to "1" to turn on a transistor 101 and off a transistor 102, so that a sense amplifier circuit 103 is disconnected from the bit lines of the memory cells MC, and an I/O pad 104 is connected to the bit lines BL of the memory cells MC. As described above, a voltage is applied from the I/O pad 104 to the drains of the memory cells MC, and an external supply voltage Vpp is applied to the gates thereof via a row decoder 105. Further, the potential of the selected word lines WL is changed by changing the external supply voltage Vpp.

Here, a Vpp/Vcc switching circuit 107 switches the supply voltages Vpp and Vcc, and supplies the external high supply voltage Vpp to one terminal of a P channel transistor 105A (the final stage buffer circuit) of the row decoder 105 in the data write operation and the supply voltage Vcc thereto in data read operation. Further, a transistor 108 switches the output of the Vpp/Vcc switching circuit 107 and the external supply voltage Vpp or vice versa in the threshold level (Vth) measuring test mode. Here, the reason why an output of a booster circuit 109 is applied to the gate of the transistor 108 is to prevent the drain voltage applied to the memory cells MC from dropping by the threshold level Vth. In FIG. 9, the circuit includes a column decoder 110, transistors 111 selected by the column decoder 110, a memory cell array 112 and an output circuit 113.

The problems involved in the conventional circuit shown in FIG. 9 will be described hereinbelow.

Here, the assumption is made that after the threshold level distributes between 0 and V2 volts after erasure as shown in FIG. 10. At this time, the external supply voltage Vpp is changed to change the voltage applied to the gate of the memory cells MC. However, if the external supply voltage Vpp drops below the threshold level of the P channel transistor 105A of the row decoder 105, the P channel transistor 105A is turned off, so that the word line WL (1) changes to a floating status, thus it being impossible to apply a reliable voltage to the gates of the memory cells MC.

In other words, when the threshold level Vth of the P channel transistor 105A is V1, it is impossible to measure the threshold distribution of the memory cells whose threshold levels lie between 0 and V1 volts shown in FIG. 10. That is, the threshold distribution of the overerased cells cannot be measured, thus raising a serious problem in evaluation of the memory cell LSI.

As described above, in the conventional memory device, it has been difficult to erase the device so that the threshold levels of the memory cells become appropriate value, and in addition it has been impossible to measure the threshold levels appropriately.

SUMMARY OF THE INVENTION

The object of the present invention is to overcome the above-mentioned problems involved in the conventional technique. When an erase voltage is applied to the sources of the data erasable and rewritable memory cells, the erasure characteristics of the memory cells can be improved by controlling the rise time of the erase voltage or increasing the erase voltage stepwise.

Another object of the present invention is to control the operation of overerased memory cells properly and to measure the threshold levels of the overerased memory cells properly.

Further, still another object of the present invention is to measure the overerased status of the memory cells properly and to secure the operation reliability of the memory LSI.

According to the present invention, when data are erased, erase voltage applying means applies an erase voltage which varies from a low voltage to a high voltage with the passage of time, to the sources of the memory cells. Therefore, the erasure operation can be effected properly without deteriorating the memory cells.

In the present invention, the row decoder selects no row lines in the test mode, and further the sources of the respective memory cells are set to the ground level. Under these conditions, in case there is an overerased memory cell, since being depleted, this overerased cell is turned on according to the depletion rate. On the basis of the potential change of the column line due to the turned-on memory cell, it is possible to detect the presence of the overerased memory cell.

In the test mode, the source biasing means applies a test potential suitable for the test to the sources of the respective memory cells. On the basis of the test potential, the threshold levels of the respective memory cells are shifted to a direction, for instance to a positive direction. Accordingly, the pseudo-threshold levels of the respective memory cells shifted in this direction can be detected; that is, it is possible to detect the overerased status of the memory cells more properly.

In the present invention, the erasure operation is effected until the threshold level of the memory cell of the highest erasure speed becomes a predetermined level, irrespective of the threshold level distribution width of the memory cells, so that it is possible to realize a higher access speed to the device of a narrower threshold distribution width, as compared with the conventional device.

In the test mode of the present invention, the row decoder selects no row lines, and further the sources of the respective memory cells are set to the ground level. Under these conditions, in case there is an overerased memory cells, since being depleted, the cell is turned on according to the depletion rate. On the basis of the turned-on memory cell, since a current path is formed between the column line connected to this overerased memory cell and the source thereof, the potential of the column line drops. That is, the potential of the column line becomes lower than a reference potential (when there is no depleted memory cell, the potential of the column line will not fall). The differential sense amplifier compares the dropped potential with a reference potential given by the reference potential generating circuit to detect the presence of the overerased memory cells.

As described above, in the present invention, when data are erased from the memory cells, the erase voltage to be applied to the sources of the memory cells is increased gradually or stepwise. Accordingly, it is possible to prevent a large current from flowing between bands, and thereby to improve the erasure characteristics. Further, it is possible Go prevent the memory cells from being deteriorated, and thereby to improve the reliability of the memory device effectively.

According to the present invention, it is possible to easily test the erased memory cells as to whether the erased memory cells are overerased or not and further to operate the overerased memory cells properly.

Further, according to the present invention, the threshold levels of the memory cells are shifted to a direction to allow a voltage applied to the sources of the memory cells to be suitable for the test. By shifting the threshold levels, it is possible to properly detect whether the memory cells are overerased or not.

Further, according to the present invention, it is possible to increase the access speed to the device of a narrower threshold distribution width.

According to the present invention, since the standard memory cells the same as the device memory cells are provided, it is possible to detect the dispersion of the device cell characteristics. In the test mode, all the row lines are not selected and another reference potential generating transistor is selected. Therefore, it is possible to secure the reliable data reading operation and further to measure the negative threshold level of the memory cells properly.

BRIEF DESCRIPTION OF THE DRAWINGS

FIG. 35 is a table listing the operating voltages of another embodiment of the semiconductor memory device according to the present invention;

FIG. 36 is a diagram showing an embodiment of the semiconductor memory device according to the present invention.

DETAILED DESCRIPTION OF THE PREFERRED EMBODIMENTS

Embodiments of the present invention will be described hereinbelow with reference to the attached drawings.

Figure 1:
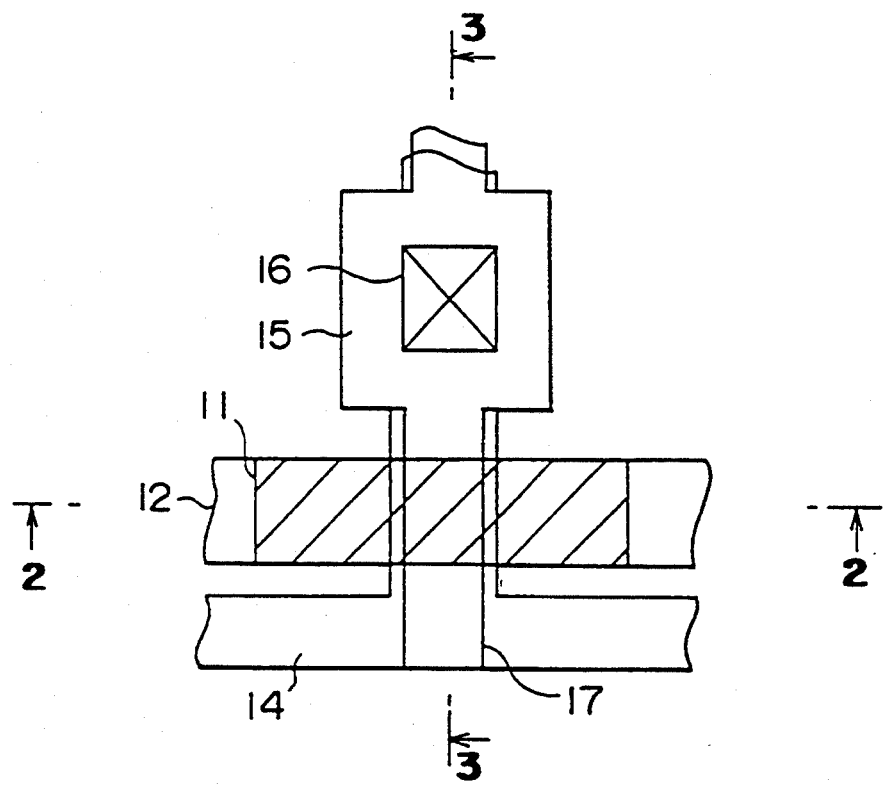
FIG. 1 is a plane view showing an ordinary memory cell pattern.
Figure 2:
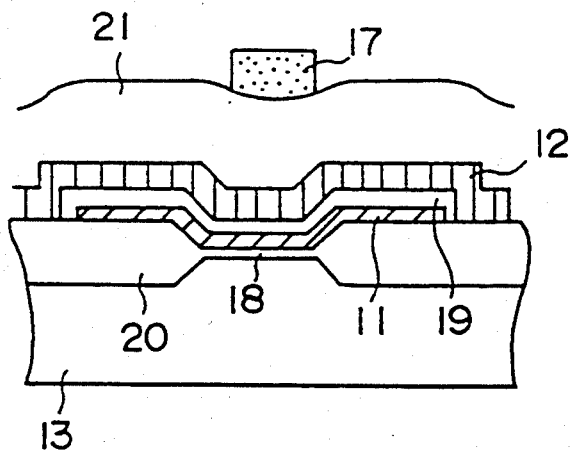
FIG. 2 is a cross-sectional view taken along the line A—A' in FIG. 1.
Figure 3:
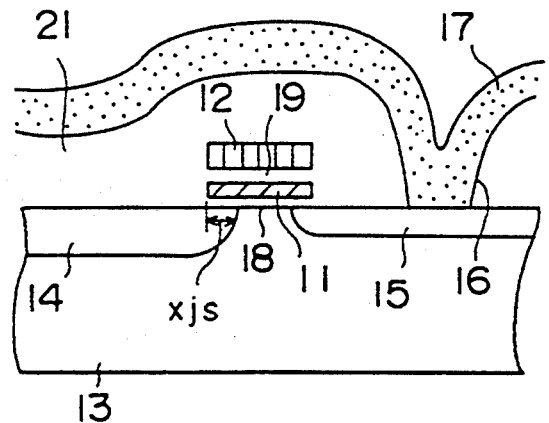
FIG. 3 is a cross-sectional view taken along the line B—B' in FIG. 1.
Figure 4:
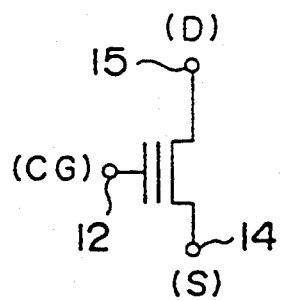
FIG. 4 is an equivalent circuit diagram of the memory cell shown in FIGS. 1 to 3.
Figure 5:
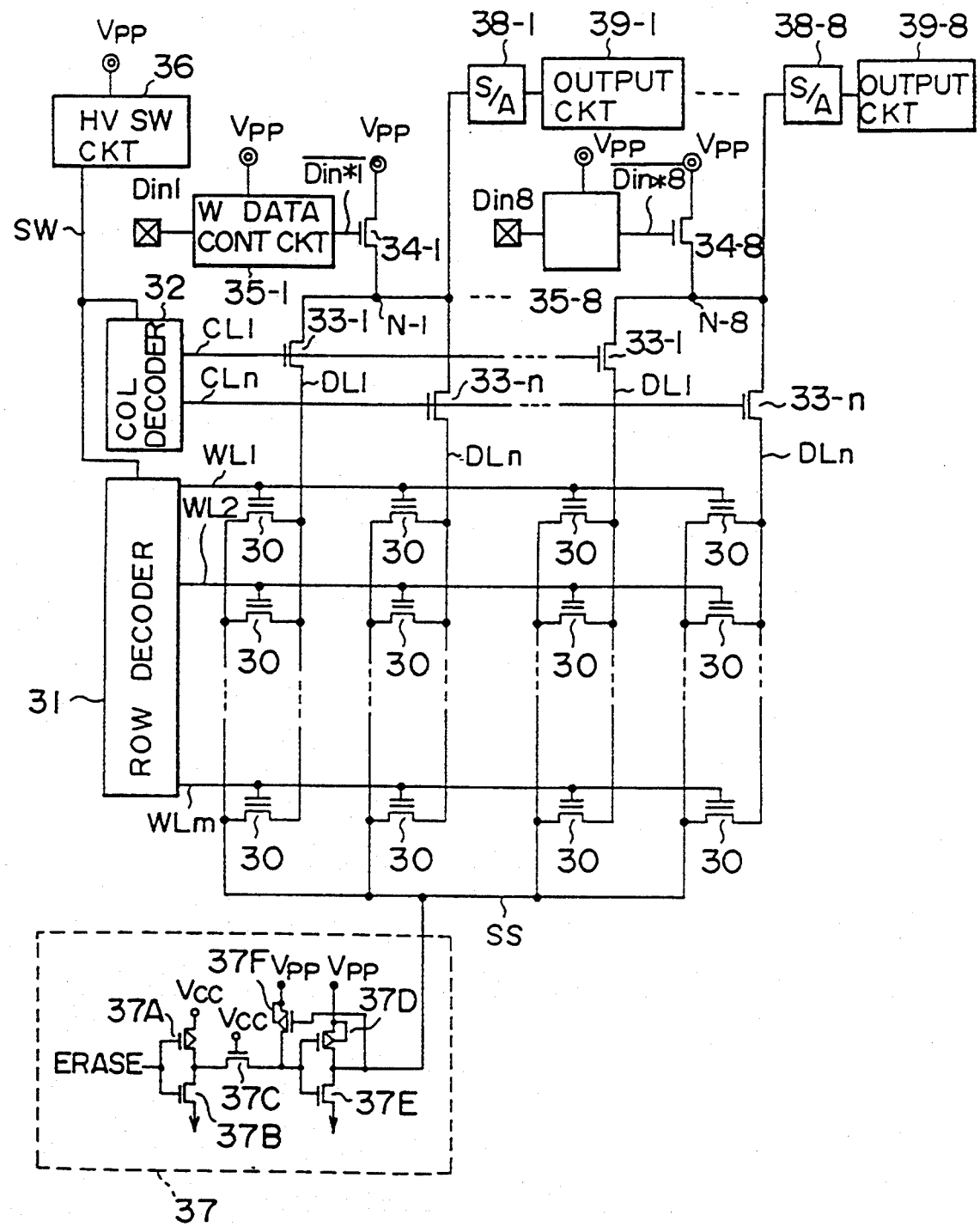
FIG. 5 is a circuit diagram showing a conventional semiconductor memory device.
Figure 6A:
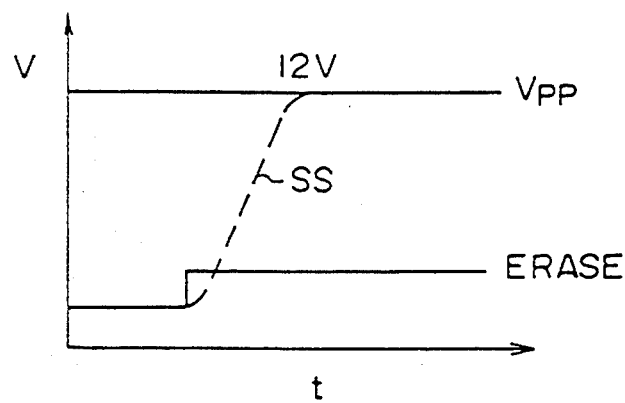
FIGS. 6A to 6C are graphical representations for assistance in explaining she operation of the memory cell shown in FIG. 4.
Figure 6B:
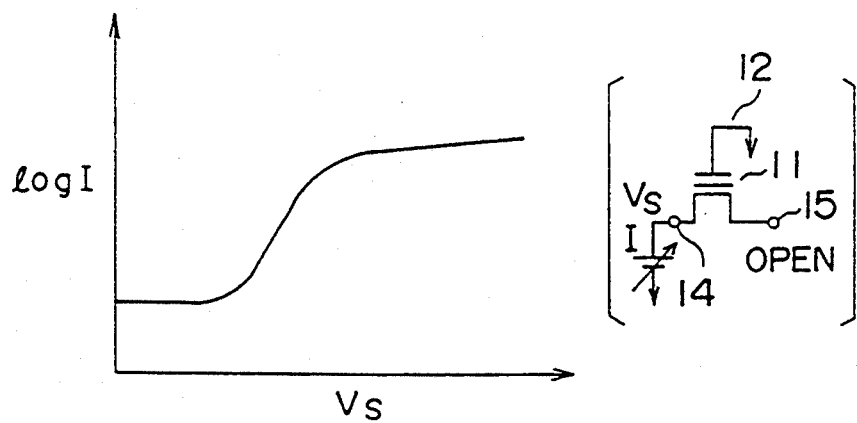
Figure 6C:
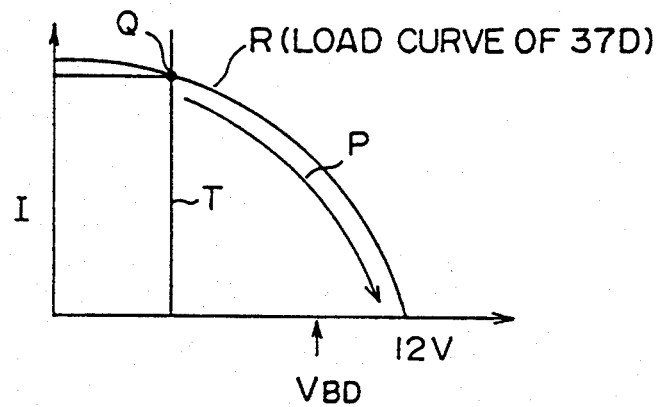
Figure 7:
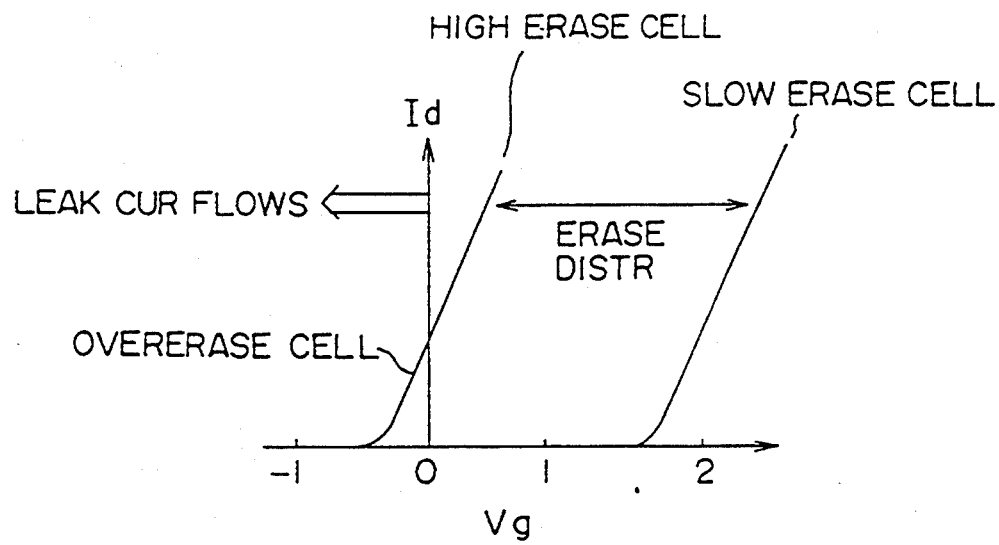
FIG. 7 is a graphical representation of erasure characteristics for assistance in explaining the operation of the memory cell shown in FIGS. 1 to 4.
Figure 8:
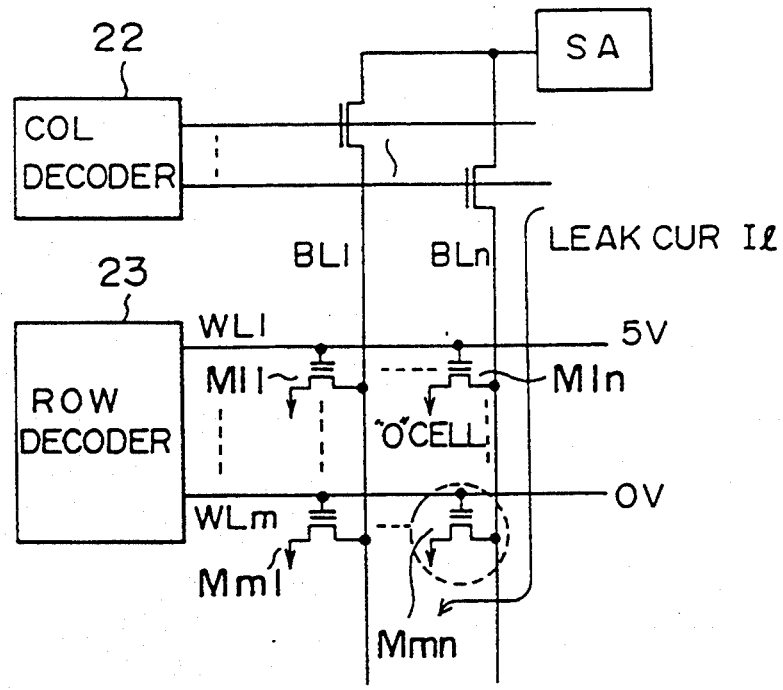
FIG. 8 is a circuit diagram for assistance in explaining the operation of a memory LSI including an overerased memory cell in the conventional semiconductor memory device.
Figure 11:
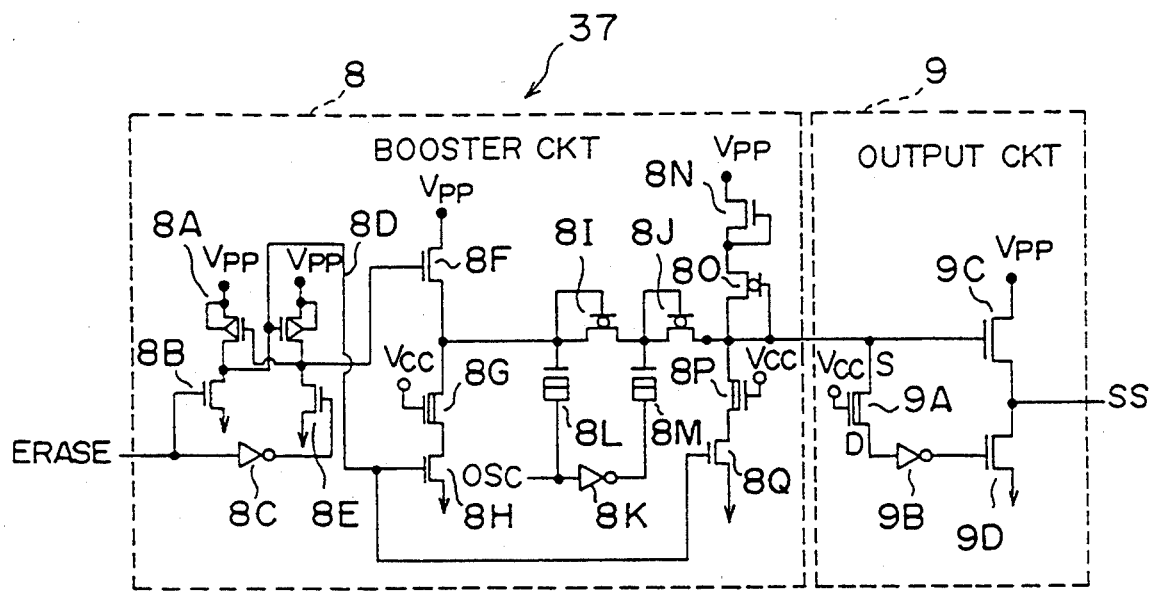
FIG. 11 is a circuit diagram showing the essential portion of an embodiment of the semiconductor memory device according to the present invention.

FIG. 11 is a circuit diagram showing the essential portion of an embodiment of the semiconductor memory device according to the present invention, in which only a source voltage control circuit 37 is shown. The circuits other than the circuit 37 are the same as those shown in FIG. 5 and the memory cells are the same as those shown in FIGS. 1, 2 and 3.

As depicted in FIG. 11, an erase signal Erase is inputted to a booster circuit 8 and then supplied to a terminal SS through an output circuit 9.

In the booster circuit 9, the erase signal Erase is inputted to the gate of an N type transistor 8B and an inverter 8C. An output of the inverter 8C is given to the gate of an N type transistor 8E. The drain of the N type transistor 8B is connected to the drain of a P type transistor 8A. The drain of the N type transistor 8B is connected to the gates of a P type transistor 8D, an N type transistor 8H and an N type transistor 8Q, respectively. The drain of the N type transistor 8E is connected to the gate of the P type transistor 8A, the gate of an N type transistor 8F, and the drain of the P type transistor 8D, respectively. The drain of the N type transistor 8F is connected to the sources of a P type transistor 8G and an N type transistor 8I. The drain of the P type transistor 8G is connected to the drain of the N type transistor 8H. An oscillation signal OSC is supplied to an inverter 8K. An input terminal of the inverter 8K is connected to the source of the N type transistor 8I via a capacitor 8L. An output of the inverter 8K is connected to the drain of the N type transistor 8I via capacitor 8M. The drain of the N type transistor 8I is connected to the source of the N type transistor 8J. The gate of the N type transistor 8I is connected to the source of the N type transistor 8I. The gate of the N type transistor 8J is connected to the source of the N type transistor 8J. The N type transistor 8N, the N type transistor 8O, the P type transistor 8P and the N type transistor 8Q are connected in series. An external high supply voltage Vpp is supplied to the drain of the N type transistor 8N. The gate of the N type transistor 8N is connected to the source thereof. The gate of the N type transistor 8O is also connected to the source thereof. The junction point of the source of the N type transistor 8O and the source of the P type transistor 8P is connected to the drain of the N type transistor 8J and the output circuit 9. The external high supply voltage Vpp is supplied to the source of the type transistor 8A, the source of the P type transistor 8D and the drain of the N type transistor 8F, respectively. Further, a supply voltage Vcc is supplied to the gate of the P type transistor 8G and the gate of the P type transistor 8P, respectively.

In the output circuit 9, the signal from the booster circuit 8 is given to the gate of an N type transistor 9C and the source of a P type transistor 9A. The drain of the P type transistor 9A is connected to the gate of an N type transistor 9D via an inverter 9B. The source of the N type transistor 9C and the drain of the N type transistor 9D are connected to the terminal SS together. The external high supply voltage Vpp is supplied to the drain of the N type transistor 9C. The supply voltage Vcc is supplied to the gate of the P type transistor 9A.

Further, in FIG. 11, the transistors designated by the transistor symbol as shown by 8I and 8J are those whose threshold level is about 0 V.

Figure 12:
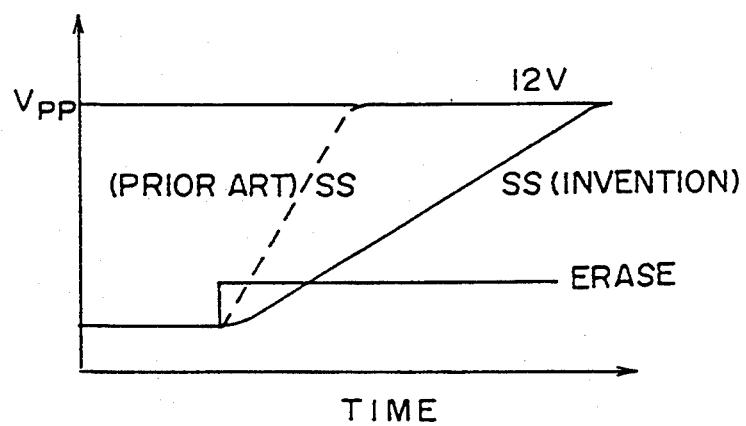
FIG. 12 is a timing chart for assistance in explaining the operation of the device shown in FIG. 11.

The operation of the circuit as described above will be described hereinbelow with reference to the waveform diagram as shown in FIG. 12.

When the erase signal Erase rises from "0" to "1", the N type transistor 8B is turned on and the N type transistor 8E is turned off. As a result, the P type transistor 8A is turned off and the P type transistor 8D is turned on. Therefore, the N type transistor 8F is turned on, and the N type transistor 8H and the N type transistor 8Q are both turned off, so that the source of the N type transistor 8I changes to "1". Here, since oscillation signal OSC is given to the N type transistors 8I and 8J via the inverter 8K, these transistors are turned on alternately. This signal "1" propagates gradually through the N type transistors 8I and 8J owing to the function of the capacitors 8L and 8M, further rises gradually to the external high supply voltage Vpp through the N type transistors 8N, 8O and 8P, and then outputted to the output circuit 9. In the output circuit 9, this voltage is given to the gate of the N type transistor 9C and further to the gate of the N type transistor 9D via the P type transistor 9A and the inverter 9B. Accordingly, the N type transistor 9D is turned off, so that the source voltage (Vss) of the N type transistor 9C rises gradually on the basis of the gate voltage thereof.

As described above, the voltage at the terminal SS rises gradually in a predetermined time to the external high supply voltage Vpp=12 V, as shown in FIG. 12, without rising immediately in response to the erase signal Erase. This rising time is determined about 1 microsecond or longer. In other words, a voltage is applied gradually to the memory cell 30 in such a way that current will not flow between bands. Accordingly, the erasure operation is made under a low voltage, so that it is possible to improve the erasure characteristics markedly. In addition, since no large current flows between bands, it is possible to prevent the gate oxide film as extremely thin as about 100 angstrom from being deteriorated.

Further, in the above embodiment, the rising time can be set to any desired time by adjusting the characteristics of the N type transistors 8N and 8O and the P type transistor 8P.

Figure 13:
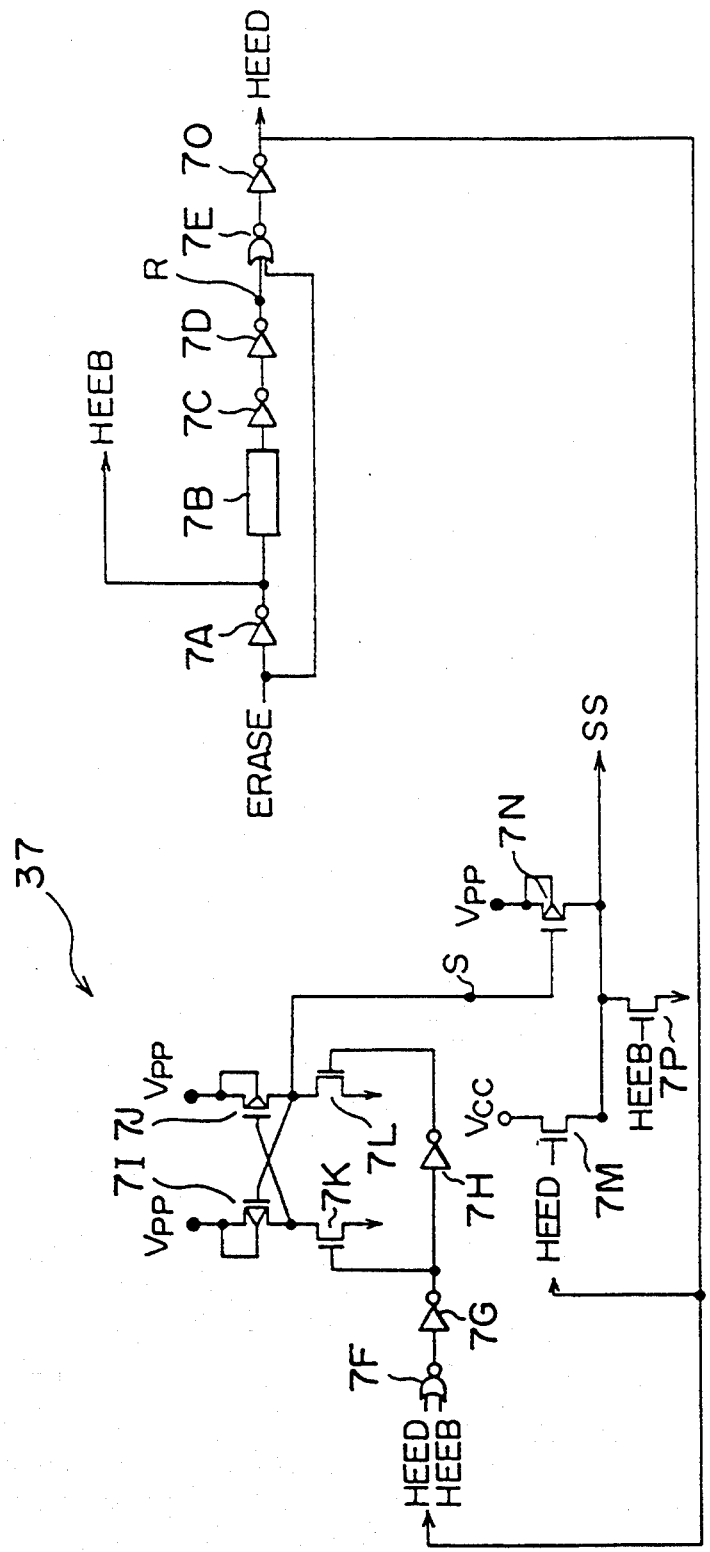
FIG. 13 is a circuit diagram showing the essential portion of another embodiment of the semiconductor memory device according to the present invention.

FIG. 13 is a circuit diagram showing the essential portion of another embodiment of the semiconductor memory device according to the present invention, in which only the source voltage control circuit 37 is shown. In this second embodiment, the circuits other than the circuit 37 are the same as those shown in FIG. 5 and the memory cells are the same as those shown in FIGS. 1, 2 and 3, in the same way as with the case of the first embodiment.

As depicted in FIG. 13, an erase signal Erase is inputted to a delay circuit 7B via an inverter 7A. The output of the delay circuit 7A is outputted to a node R via inverters 7C and 7D. The erase signal Erase and the signal at the node R are inputted to an NAND gate 7E, and the output thereof is taken out via an inverter 7O as a signal HEED. On the other hand, the erase signal Erase inverted by the inverter 7A is taken out as a signal HEEB. Both the signals HEEB and HEED are inputted to an NOR gate 7F, and outputted to the gate of an N type transistor 7K via an inverter 7G and further to an inverter 7H. The output of the inverter 7H is outputted to the gate of an N type transistor 7L. The drain of an N type transistor 7K is connected to the drain of a P type transistor 7I and the gate of a P type transistor 7J. The drain of the N type transistor 7L is connected to the drain of the P type transistor 7J and the gate of the P type transistor 7I. The drains of the P type transistor 7J and the N type transistor 7L are connected to the gate of a P type transistor 7N. On the other hand, the signal HEED is inputted to the gate of an N type transistor 7M. The signal HEEB is also inputted to the gate of an N type transistor 7P. The source of the N type transistor 7M and the drain of the N type transistor 7P are connected to a terminal SS together with the drain of the P type transistor 7N. The respective sources of the P type transistor 7I, the P type transistor 7J and the P type transistor 7N are connected to the external high supply voltage Vpp. The drain of the N type transistor 7M is connected to the supply voltage Vcc. The external high supply voltage Vpp is about 12 volts, while the supply voltage Vcc is about 5 volts.

Figure 14:
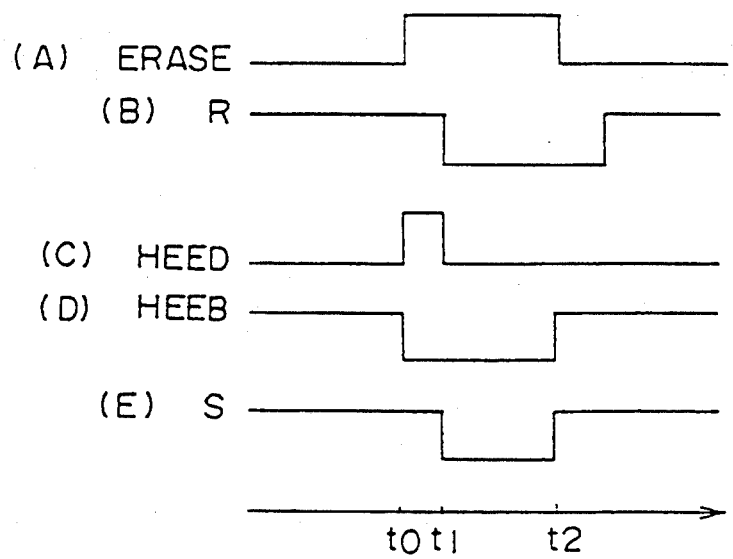
FIG. 14 is a timing chart for assistance in explaining the operation of the device shown in FIG. 13.
Figure 15:
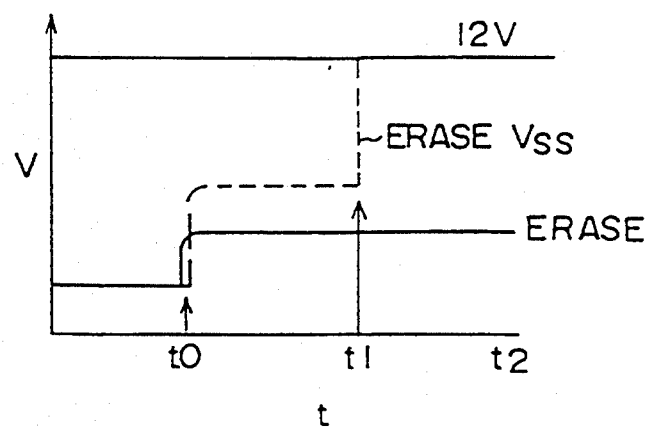
FIG. 15 is a waveform diagram for assistance in explaining the operation of the device shown in FIG. 13.

The operation of the circuit as described above will be described hereinbelow with reference to the timing chart as shown in FIG. 14 and the waveform diagram as shown in FIG. 15. In FIG. 14, (A) shows the erase signal Erase; (B) shows the node R status; (C) shows the signal HEED; (D) shows the signal HEEB; and (E) shows the node S status, respectively.

Now, when the erase signal Erase rises between a time t0 and a time t2 as shown in FIG. 14(A), the output signal HEEB of the inverter 7A (to which the erase signal Erase is inputted) is at "0" between the times t0 and t2 as shown in FIG. 14(D). This inverted erase signal of the signal Erase is delayed through the delay circuit 7B, so that the signal at the node R connected to the delay circuit 7B via the inverters 7C and 7D falls at a time t1 as shown in FIG. 14(B). The erase signal Erase and the node R signal are NORed by the NOR gate 7E and further inverted by the inverter 7O, so that the signal HEED of "1" between the time t0 and t1 can be obtained as shown in FIG. 14(C).

The signals HEED and HEEB thus obtained are given to the NOR gate 7F, so that the signal "0" is inputted to the gate of the N type transistor 7K via the inverter 7G and further the signal "1" is inputted to the gate of the N type transistor 7L via the inverter 7H both between the time t1 and the time t2, respectively. As a result, the N type transistor 7K is turned off; the N type transistor 7L is turned on; the P type transistor 7I is turned on; and the P type transistor 7J is turned off. Therefore, the node S connected to the drains of the P type transistor 7J and the N type transistor 7L is at "0" between the time t1 and the time t2 as shown in FIG. 14(E). This signal "0" is inputted to the gate of the P type transistor 7N, so that the P type transistor 7N is kept turned on during this time period.

On the other hand, the signal HEED is also given to the gate of the N type transistor 7M, so that the N type transistor 7M is kept turned on between the time t0 and the time t1. Further, the signal HEEB is given to the gate of the P type transistor 7P, so that the N type transistor 7P is kept turned off between the time t0 and the time t2.

In other words, when the erase signal Erase is at "0", the HEEB and the node S are at "1" and the signal HEED is at "0", so that the terminal SS is at the ground level. On the other hand, when the erase signal Erase rises at the time t0, the signal HEED is at "1" during the time determined by the delay circuit 7B (between t0 and t1). As a result, the N type transistor 7M (to the gate of which the signal HEED is applied) is turned on to charge the terminal SS to a voltage level (Vcc−Vth). Thereafter, the node S is at "0" between the time t1 and the time t2, so that the P type transistor 7N is turned on to set the voltage at the terminal SS to the external high supply voltage Vpp.

As the result of the operation as described above, a relatively low voltage level (Vcc−Vth) can be outputted to the terminal SS between t0 and t1 and a relatively high supply voltage (Vpp) is outputted to the terminal SS between t1 and t2, as shown in FIG. 15. That is, it is possible to apply a stepwise increased high voltage to the terminal SS. As a result, in the memory cell 30 to the source of which the erase voltage is applied through this terminal SS, it is possible to prevent voltage from being applied to the memory cell instantaneously; that is, to apply the voltage thereto in such a way that current will not flow between the bands. In other words, the erasure operation can be made at relatively low voltage, it is possible to improve the erasure characteristics markedly.

Figure 16:
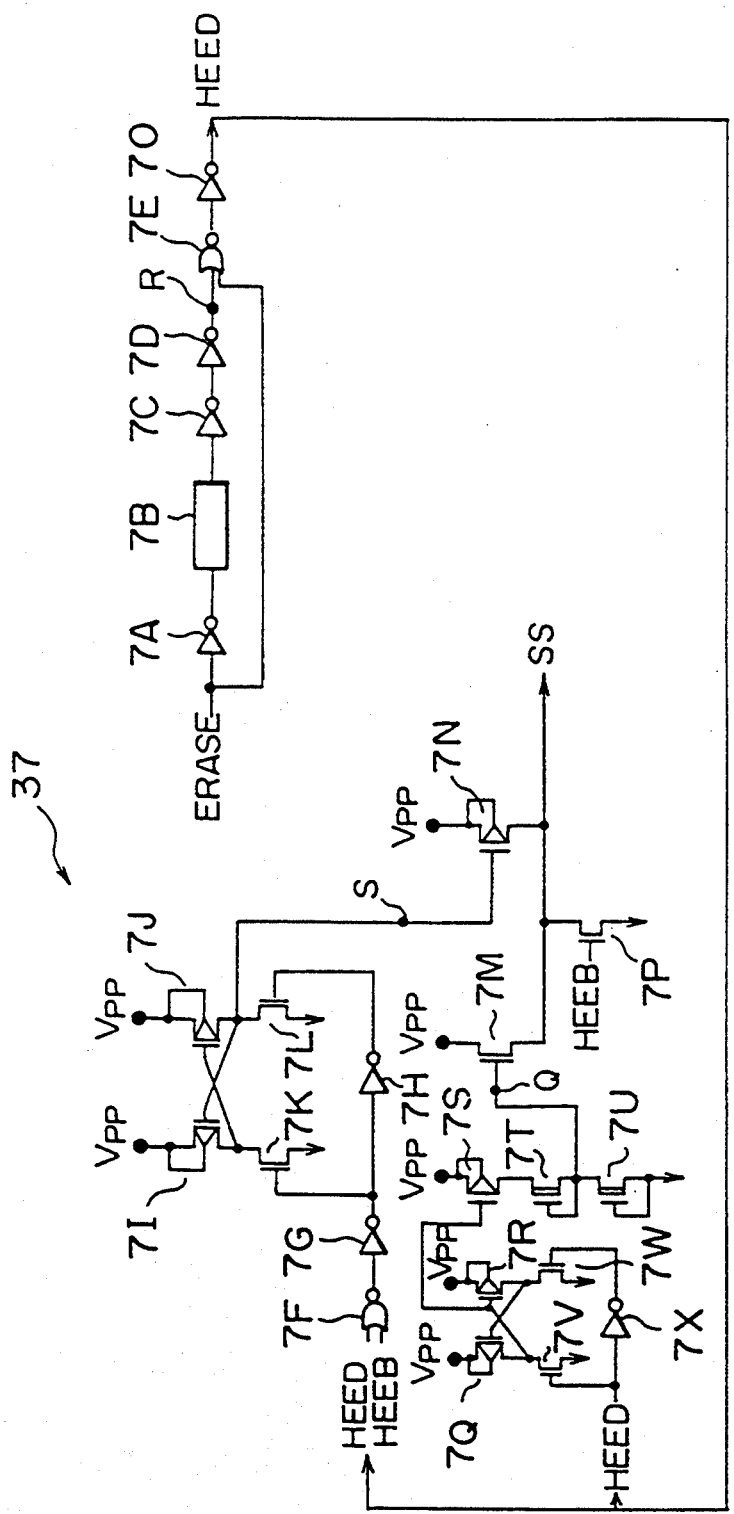
FIG. 16 is a circuit diagram showing the essential portion of still another embodiment of the semiconductor memory device according to the present invention.

FIG. 16 is a circuit diagram showing the essential portion of still another embodiment of the semiconductor memory device according to the present invention, in which only the source voltage control circuit 37 is extracted. In this embodiment, the circuits other than the circuit 37 are the same as those shown in FIG. 5 and the memory cells are the same as those shown in FIGS. 1, 2 and 3, in the same way as with the case of the first embodiment.

As shown in FIG. 16, the signal HEED is given to the gate of an N type transistor 7V and the gate of an N type transistor 7W via an inverter 7X. The drain of the N type transistor 7V is connected to the drain of P type transistor 7Q and the gate of a P type transistor 7R. The drain of the N type transistor 7W is connected to the drain of the P type transistor 7R and the gate of the P type transistor 7Q. The drain of the N type transistor 7V is further connected to the gate of a P type transistor 7S. The P type transistor 7S constitutes a series circuit together with an N type transistor 7T and an N type transistor 7U. The drain of the N type transistor 7T and the source of the N type transistor 7U are connected to the gate of an N type transistor 7M via a node Q. The respective sources of the P type transistors 7Q, 7R, 7I, 7J, 7S, and 7N are connected to the external high supply voltage terminal Vpp, respectively. Further, the drain of the N type transistor 7M is connected to the external high supply voltage terminal Vpp. The circuit configuration other than the above is roughly the same as that shown in FIG. 13, except that the gate voltage of the N type transistor 7M is set to any given intermediate voltage determined by the gm (mutual conductance) ratio of the transistor 7T to the transistor 7U.

Figure 17:
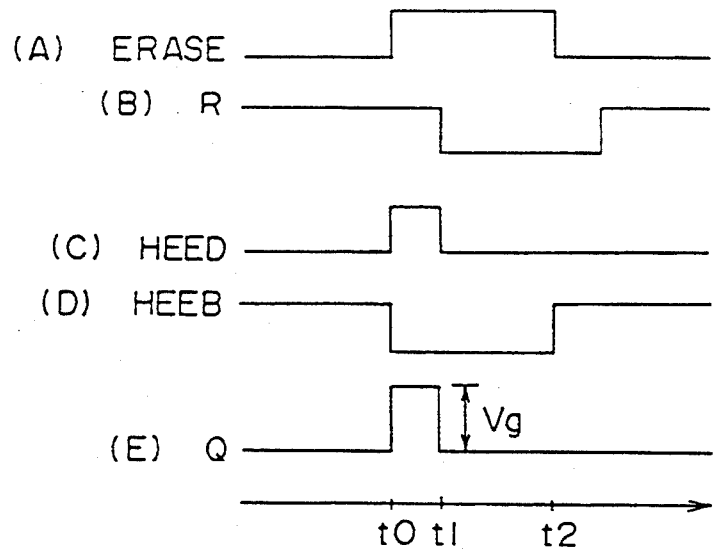
FIG. 17 is a timing chart for assistance in explaining the operation of the device shown in FIG. 16.
Figure 18:
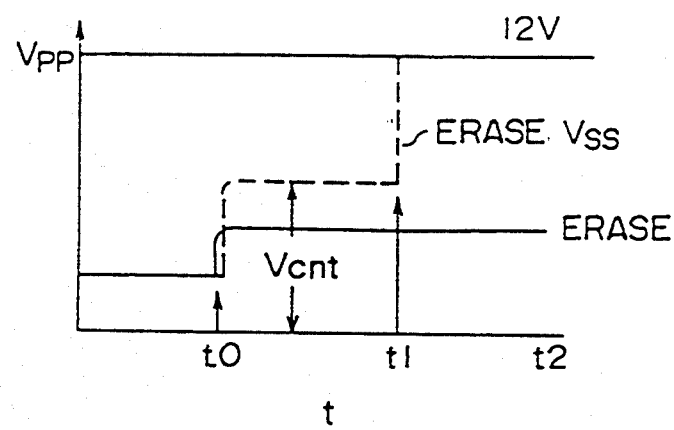
FIG. 18 is a waveform diagram for assistance in explaining the operation of the device shown in FIG. 16.

The operation of the circuit as shown in FIG. 16 will be described hereinbelow with reference to the timing chart as shown in FIG. 17 and the waveform diagram as shown in FIG. 18. In FIG. 17, (A) shows the erase signal Erase; (B) shows the node R status; (C) shows the signal HEED; (D) shows the signal HEEB; and (E) shows the node Q status, respectively.

The signal HEED is at "1" between a time t0 and a time t1, so that the gate of the N type transistor 7V is set to "1" and the gate of the N type transistor 7W is set to "0" via the inverter 7X. As a result, the P type transistor 7S is turned on; the P type transistor 7R is turned off; and the P type transistor 7S is turned on, so that the external high supply voltage Vpp is applied to the series circuit of the N type transistors 7T and 7U. Therefore, as shown in FIG. 17(E), a voltage Vg determined by the gm ratio of the N type transistor 7T and the N type transistor 7U is applied to a junction point Q between the N type transistors 7T and 7U. This voltage Vg is given to the gate of the N type transistor 7M. As a result, as shown in FIG. 18, a voltage Vcnt corresponding to the voltage Vg at the node Q develops at the source of the N type transistor 7M, and then outputted through the terminal SS.

As described above, in the circuit configuration as shown in FIG. 16, it is possible to determine the voltage to be outputted through the terminal SS between t0 and t1 to any given value between the ground level and the external high supply voltage Vpp. In other words, it is possible to freely determine the erasure voltage applied to the memory cell to an intermediate level between the ground level and the Vpp (12V), by setting the gm (mutual conductance) of the N type-transistor 7T and the gm of the N type transistor 7U to appropriate values.

As the result of the operation as described above, any given voltage Vcnt can be outputted to the terminal SS between t0 and t1 and a relatively high supply voltage (Vpp) can be outputted to the terminal SS between t1 and t2, as shown in FIG. 18. That is, it is possible to apply a stepwise increased high voltage to the terminal SS. As a result, in the memory cell 30 to the source of which the erase voltage is applied through this terminal SS, it is possible to prevent voltage from being applied to the memory cell instantaneously; that is, to apply the voltage thereto in such a way that current will not flow between the bands. In other words, since the erasure operation can be made at relatively low voltage, it is possible to improve the erasure characteristics markedly.

Further, in the embodiments shown in FIGS. 13 and 16, the voltage at the terminal SS is increased stepwise by setting only one intermediate step (the voltage (Vcc−Vth) or any given voltage Vg below the external high supply voltage Vpp). Without being limited thereto, however, it is of course possible to gradually increase the erasure voltage at the terminal SS stepwise by setting two or more intermediate steps. In this case, various circuit configuration may be considered as follows: other delay circuits other than the delay circuit $7b$ are provided; the circuit configuration as shown in FIG. 13 is combined with that as shown in FIG. 16; or plural stages of the circuit configuration as shown in FIG. 16 are connected.

Another embodiment of the semiconductor memory device according to the present invention will be described hereinbelow with reference to FIG. 19. In the drawing, memory cells Ml1 to Mln and Mm1 to Mmn arranged in a matrix pattern are connected to row lines WL1 to WLn and column lines BL1 to BLn, respectively. The respective sources of these memory cells are connected to an output terminal Vss* of a source switching circuit 25. An output circuit 24 is connected to the sense amplifier SA connected to the column lines BL1 to BLn, to read signals. The respective gates of the memory cells Ml1 to Mln and Mm1 to Mmn are connected to the row lines WL1 to WLn for each row; and the respective drains thereof are connected to the column lines BL1 to BLn for each column, respectively. The column lines BL1 to BLn are connected to a common junction point N10 via enhance type column line select transistors Tr1 to Trn controlled by output signal lines CL1 to CLn applied from the column decoder 22 to the gates thereof. This common junction N10 is connected to the sense amplifier SA. The sense amplifier SA detects and amplifies the data stored in the memory cells Ml1 to Mln and Mm1 to Mmn, and outputs the detected data to the outside via the output circuit 24. In this embodiment, the sense amplifier SA is of such a type that after the amplitude of the bit line has been amplified, an inverter is used to detect the data, without using the dummy cell type circuit.

The operation of the memory device as described above will be described. In order to test the semiconductor memory device as to whether overerased or not, all the outputs of the row decoder 23 are set to the non-select status; that is, the word lines WL1 to WLm are set to the ground level (=0 V). Further, a test signal test is applied to the source switching circuit 25 to set the output terminal Vss of this source switching circuit 25 to the ground level (0 V). As a result, the source terminals of the memory cells Ml1 to Mln and Mm1 to Mmn are fixed to the ground level. Under these conditions, the column lines BL1 to BLn are switched and selected in sequence by the column decoder 22, to read the data Through the sense amplifier SA. At this time, it is possible to check whether there are overerased memory cells. In more detail, when an overerased memory cell is connected to the selected column lines BL1 to BLn, since the threshold voltage of the overerased memory cell is negative in the depletion status, a leak current flows through the selected column line Properly, since the column lines BL1 to BLn are charged, the output obtained through the sense amplifier SA and the output circuit 24 must be at "0". In case of the overerased cell, however, the output circuit 24 outputs a signal "1" due to the presence of the leak current. Therefore, when the signal of "1" is detected, the LSI chip is discriminated as being defective by this test, and removed from the manufacturing process.

In the read status, the test signal test given to the source switching circuit 25 is turned off to bias the output terminal Vss* thereof to about 0.5 V. Therefore, the sources of the memory cells are biased at about 0.5 V, thus securing a wide operation margin for the overerased memory cell.

Figure 20A:
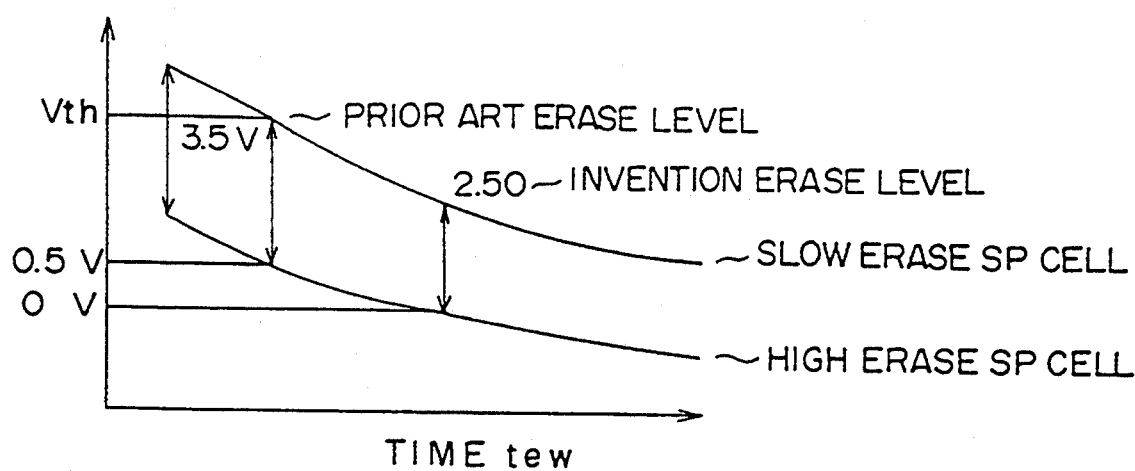
FIGS. 20A to 20C are graphical representations for assistance in explaining the operation of the device shown in FIG. 19.
Figure 20B:
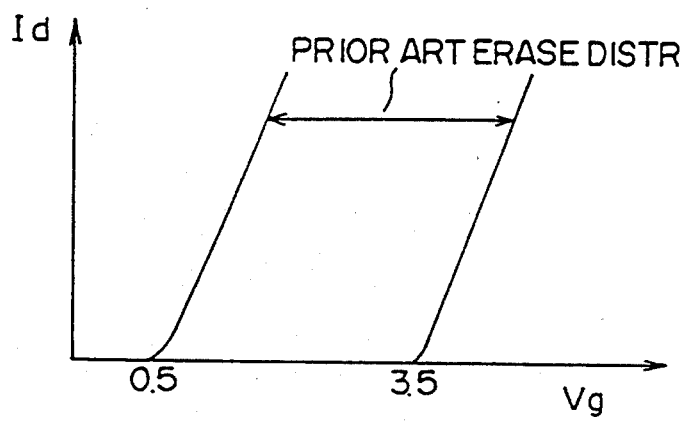
Figure 20C:
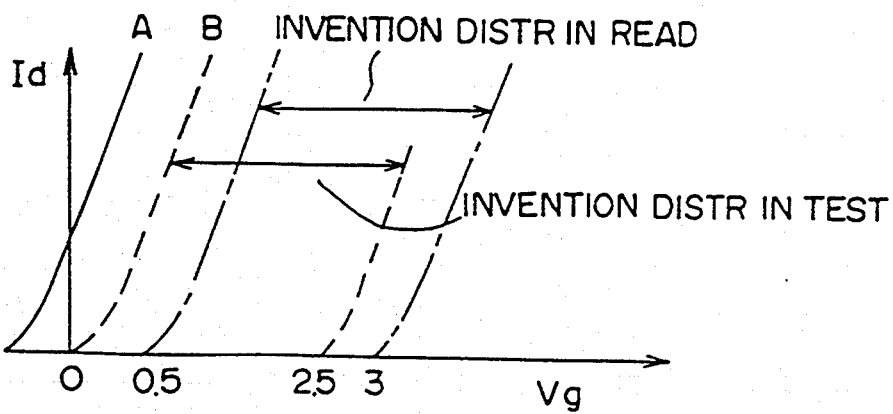

The above-mentioned operation margin will be described in more detail with reference to FIGS. 20A to 20C. FIG. 20A shows the characteristics of the threshold level dependent upon the time in erasure operation, in which the time tew is taken along the abscissa and the threshold voltage Vth is taken along the ordinate. FIG. 20B shows the threshold distribution of the conventional test method, in which the gate voltage Vg is taken along the abscissa and the drain current Id is taken along the ordinate. Further, FIG. 20C shown the threshold distribution of the test method for the semiconductor memory device according to the present embodiment, in which the gate voltage Vg is taken along the abscissa and the drain current Id is taken along the ordinate.

As already explained, in an actual LSIs, there are cells erased at high speed and cells erased at low speed in the erasure operation. FIG. 20A shows the experimental data representative of the time-dependent characteristics of the threshold level in erasure operation; that is, the change in the threshold voltage with the lapse of time between the high erasure speed cell and the row erasure speed cell. Here, it should be noted that in the conventional test of the semiconductor memory cell, when the threshold voltage (at which the erasure is determined) of the slowest erasure speed memory cell is 3.5 V, the threshold voltage of the highest erasure speed memory cell is 0.5 V, with the result that the threshold distribution width is as wide as 3 V. In contrast with this, in the test of the semiconductor memory device of the present embodiment, since the erasure operation is made at a further lower threshold voltage level, it is possible to reduce this distribution width. That is, when the lowest speed cell is erased down to 2.5 V, the threshold voltage of the highest speed memory cell is at 0 V, with the result that the distribution width is 2.5 V, which is narrower than that (3.0 V) of the conventional method of testing the semiconductor memory cell. FIGS. 20B and 20C show the characteristics between the gate voltage Vg and the drain current Id of the memory cell under the above-mentioned conditions.

The characteristics shown in FIG. 20C will be described in more detail. With respect to an LSI including a memory cell of the characteristic curve A in the erasure operation, since leak current will flow under the test conditions that the gate voltage is 0 V and the source voltage is 0 V, this LSI can be removed during the manufacturing process, so that there exists no problem with respect to such defective LSI as described above. With respect to an LSI including a memory cell of the characteristic curve B, since the threshold voltage is about 0.2 V, leak current will not flow in the conventional leak current measuring test effected under the condition that the row lines WL1 to WLn are set to the ground level, so that it is impossible to remove this LSI from the non-defective LSIs. In the ordinary EEPROM, it is necessary to guarantee the data writing and erasing cycles of about $10^4$ to $10^5$ times. In the case of the memory cells having the threshold value of about 0.2 V, in case the insulating film deteriorates in the writing and erasing cycles, since the memory cells are easily depleted as compared with the memory cells having the threshold value of about 0.5 V, there exists a possibility of the flowing leak current, so that it is impossible to guarantee the reliability of the device.

In contrast with this, in the semiconductor memory device according to the present invention, in order to guarantee the operation reliability of the memory cells of that sort (having the threshold of about 0.2 V), it is possible to increase the operation margin by increasing the threshold voltage apparently, by applying a bias voltage to the sources of the memory cells; that is, by setting the output terminal Vss* of the source switching circuit 25 to 0.5 V in the ordinary data read operation.

In general, this phenomenon is known as substrate effect, which is extremely important characteristics from the deign standpoint. That is, when the substrate is biased in the reverse direction relative to the source, a depletion layer is widened between the substrate and the channel, and therefore the quantity of the electric charge also increases in the depletion layer. Accordingly, the gate electric field necessary to form the channel increases, and therefore the apparent threshold voltage also increases. That is, when the above-mentioned effect is utilized, it is possible to shift the memory cell having the threshold voltage of about 0.2 V to the memory cell having the threshold voltage of about 0.8 V, by applying a voltage of about 0.5 V to the source of the memory cell, as shown in FIG. 20C. Further, since the non-selected gate voltage is 0 V, the gate voltage is to be set to −0.5 V relative to the source voltage, so that it is possible to increase the operation margin by widening the voltage difference between the threshold voltage and the voltage at which the leak current flows due to depletion. In addition, the threshold voltage of the row erasure speed memory cell is increased from 2.5 V to about 3.0 V by applying the bias voltage to the source of the memory cell. Here, it should be noted that in the case of the conventional test, the threshold voltage of the lowest erasure speed memory cell is 3.5 V. In the case of the test of the present embodiment, the threshold voltage of the memory cell can be reduced to 3 V, which is lower than the conventional threshold value. Accordingly, it is possible to flow a larger operating current in the data read operation, thus enabling a high speed access.

Figure 19:
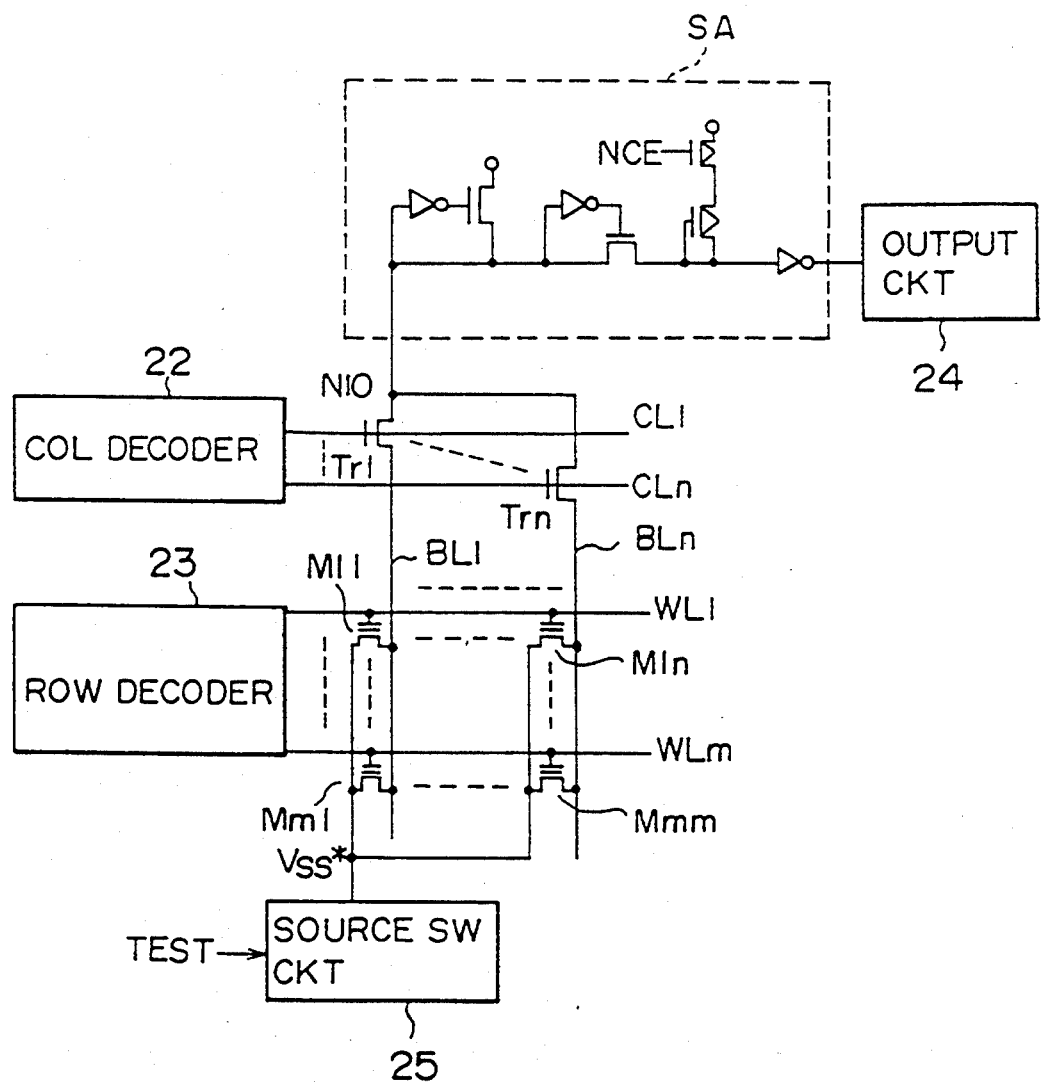
FIG. 19 is a circuit diagram showing an embodiment of the semiconductor memory device according to the present invention.
Figure 21:
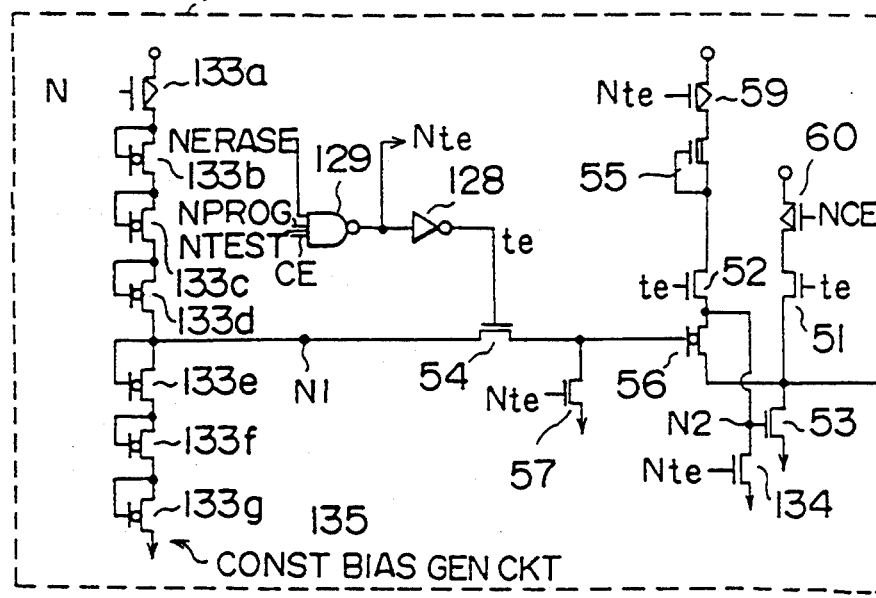
FIG. 21 is a circuit diagram showing an example of the source switching circuit of the device shown in FIG. 19.
Figure 21:
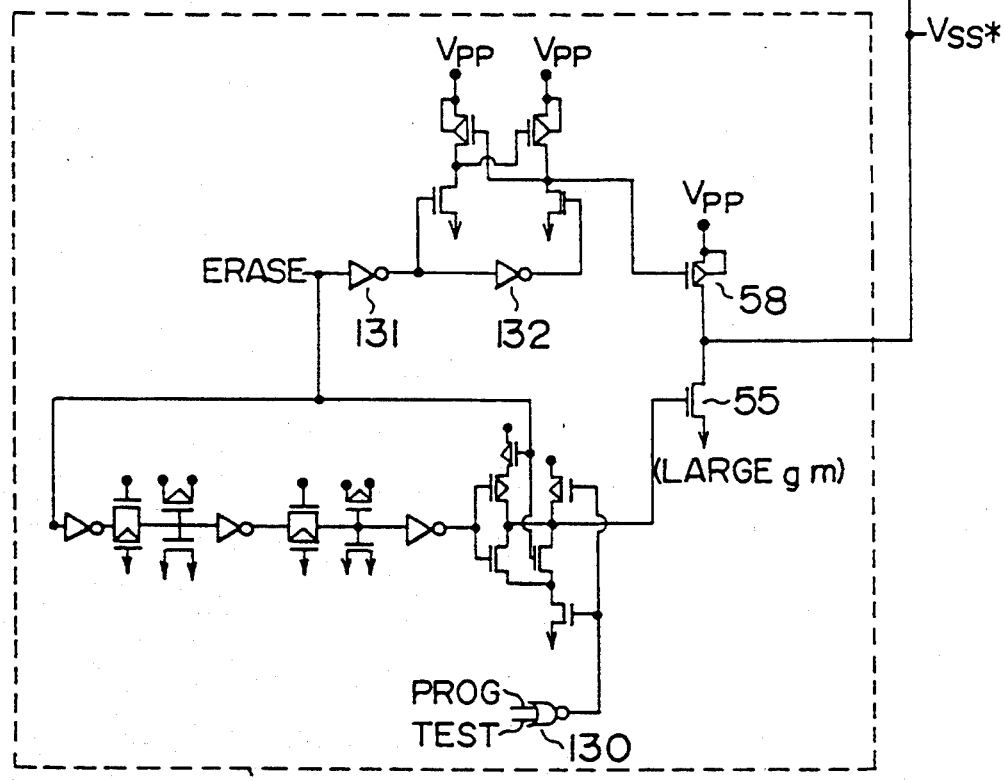

FIG. 21 is a circuit diagram showing an example of the source switching circuit 25 included in the device shown in FIG. 19. As shown, the source switching circuit 25 is composed of a source bias circuit 126 for applying a bias voltage to the sources of the memory cells during test, and an erase circuit 127 for applying a high voltage to the sources thereof during erasure. The output terminal Vss* of the source switching circuit 25 is connected to the sources of the memory cells Ml1 to Mln and Mm1 to Mmn. In she source bias circuit 126, a signal CE switches the chip from the operating condition to the non-operating condition, in which the signal is at "1" in the operating condition.

Further, a signal PROG is at "1" in the program mode. The signal Erase changes to "1" to set the chip to the erasure mode. The test signal test is used to test whether the memory cell is overerased or not, which is set to "1" in the test mode. The respective signals can be listed in the respective modes as follows:

Further, transistors designated by the symbol 133b indicates the transistors having the threshold voltage of about 0 V.

TABLE 1

| Mode/Signal | Test | Erase | PROG | Vss* |
| --- | --- | --- | --- | --- |
| Test | 1 | 0 | 0 | 0 V |
| Erase | 0 | 1 | 0 | Vpp |
| Read | 0 | 0 | 0 | 0.5 V |
| Program | 0 | 0 | 1 | 0 V |

In FIG. 21, a signal NErase, a signal NPROG, a test signal Ntest and a signal CE are inputted to a logic circuit 129 to output a NANDed signal as a signal Nte. This signal is inverted by an inverter 128 to a signal te. The signal te is given to the gate of a transistor 54 connected between a node N1 and the gate of the transistor 56. Another transistor 57 is connected between the gate of the transistor 56 and the ground level. The signal Nte is applied to the gate of the transistor 57. Transistors 59, 55, 52, and 56 are connected in series to the output terminal Vss*. The signal Nte is applied to the gate of the transistor 59; the signal te is applied to the gate of the transistor and the signal Nte is applied to the gate of the transistor 134, respectively. Further, the transistors 60, 51 and 53 are connected in series. The junction point between the transistors 51 and 53 is also connected to the output terminal Vss*. Further, a signal NCE is applied to the gate of a transistor 60; and the signal te is applied to the gate of the transistor 51. A node N2 or the junction point between the transistors 52 and 56 is connected to the gate of the transistor 53. Further, a constant bias generating circuit 135 is formed by a series-connected circuit of transistors 133a to 133g. The signal Nte is applied to the gate of the transistor 133a.

In the erase circuit 127, the signal Erase is given to a series circuit of inverters 131 and 132, to control the gate of a transistor 58 connected to the output terminal Vss*. Further, the signal PROG and the test signal test are inputted to a logic circuit 130 of the erase circuit 127. The output of the logic circuit 130 controls the gate of the transistor 55 having a large gm (mutual conductance) and connected to the output terminal Vss*. The supply voltage Vcc is supplied to the transistor 58.

In the configuration as described above, in the test mode the test signal test changes to "1", and the signals PROG and the signal Erase are both set to "0". Under these conditions, the transistors 51, 52, 53 and 54 are all turned off, and the transistor 55 on the side of the erase circuit 127 is turned on. Therefore, the output terminal Vss* connected to the sources of the memory cells Ml1 to Mln and Mm1 to Mmn is fixed to 0 V.

On the other hand, in the read mode, the test signal test and the signal PROG are both set to "0". Under these conditions, the transistors 55 and 56 are turned off. At this time, the transistors 51, 52, 53 and 54 on the side of the source bias circuit 126 are turned on, so that the source bias circuit 126 is operative. Accordingly, a bias voltage of about 0.5 V is applied to the sources of the memory cells Ml1 to Mln and Mm1 to Mmn via the output terminal Vss*. That is, the transistor 57 is turned off, and the node N1 is set to an intermediate level determined by the constant bias generating circuit 135. In addition, since the gate potential of the transistor 56 becomes the intermediate level, the potential at the node N2 drops down near the ground level. Here, the gm of the transistor 55 is smaller than that of the transistor 56. Further, since the transistor 51 is turned on, the potential at the output terminal Vss* rises through transistor 51. When this potential rises beyond the potential at the node N2, the transistor 53 is turned on to suppress a further rise in potential at the output terminal Vss*. Further, when the potential at the output terminal Vss* drops below a predetermined level, since the terminal Vss* is charged through the transistor 51, the potential at the output terminal Vss* is kept at about 0.5 V. Further, it is possible to freely set the potential at the output terminal Vss* to any given value, by changing the junction point between the node N1 and the constant bias generating circuit 135.

Further, in the erase mode, the signal Erase is at "1" and the test signal test and the signal PROG are at "0". That is, when the transistors 51, 52, 53 and 54 are turned off and thereby the voltage at the output terminal Vss changes to a high voltage, it is possible to prevent the leak current from flowing to the supply voltage Vcc. When the transistor 55 is turned off and the transistor 56 is turned on, a high supply voltage Vpp is applied to the output terminal SS via the transistor 56. Further, when the erase mode ends and therefore the signal Erase changes to "0", a pulse signal is applied to the gate of the transistor 55 for a predetermine time period to discharge the high voltage applied to the output terminal Vss*.

Further, in the program mode, the signal PROG is at "1", and the test signal test and the signal Erase are at "0", so that the transistors 51, 52, 53 and 54 are turned off to discharge the current flowing in the data writing operation. Therefore, the transistor 55 is turned on to fix the sources of the memory cells Ml1 to Mln and Mm1 to Mmn to the ground level.

Figure 22:
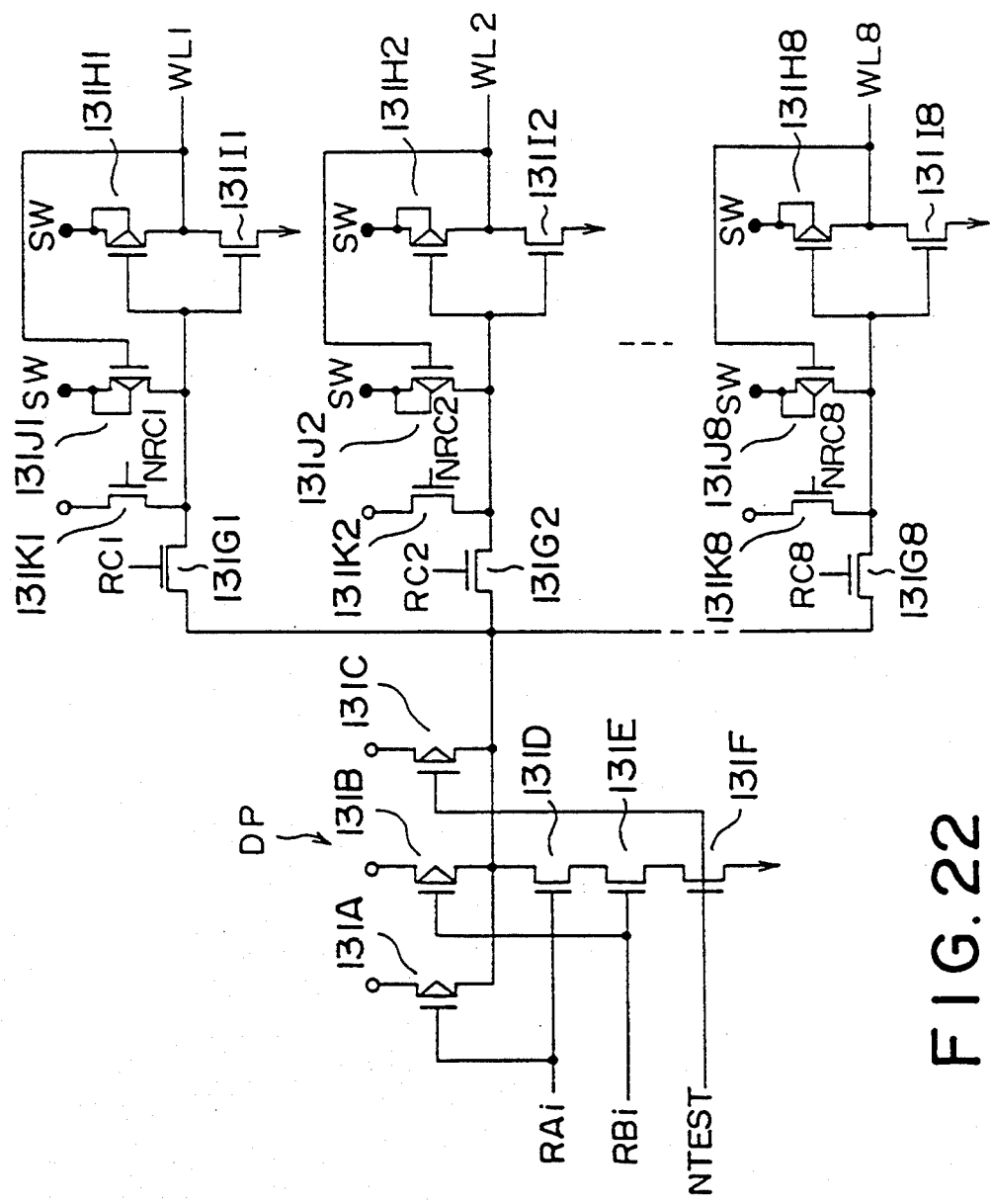
FIG. 22 is a circuit diagram showing a practical configuration of the row decoder shown in FIG. 19.

FIG. 22 shows a practical example of the row decoder shown in FIG. 19. As shown, the row decoder is composed of Parallel-connected p channel transistors 131A to 131C and a series-connected N channel transistors 131D, 131E and 131F. The gates of the transistors 131A to 131C are connected to the gates of the transistors 131D to 131F, respectively. An address signals RAi and RBi, and a signal NTEST (at "0" in the test mode) are applied to the gates of the transistors 131D to 131F, respectively to obtain decode outputs. The decode outputs are selected by select transistors 131G1 to 131G8 having the gates to which address signals RC1 to RC8 are inputted, respectively. These select transistors 131G1 to 131G8 function as level shift transistors.

The output sides of these select transistors 131G1 to 131G8 are connected to N channel transistors 131K1 to 131K8 having the gates to which address signals NRC1 to NRC8 are inputted, respectively. Further, pulling-up transistors 131J1 to 131J8 are connected. P channel transistors 131H1 to 131H8 and N channel transistors 131I1 to 131I8 constitute a buffer circuit. Select signals are outputted to the output lines of the row decoder 23; that is, the row lines WL1 to WLn via this buffer circuit.

Further, a supply voltage is supplied to terminals SW from a booster circuit (not shown), whose supply voltage is 12 V in the data write operation and 5 V in the data read operation. In the test mode, since the signal NTEST changes to "0", all the row lines WL1 to WLn are set to the ground level in the non-selected status. On the other hand, in the ordinary read status, since the signal NTEST changes to "1", one of the row lines WL1 to WLn is decoded and selected on the basis of the address signals RAi, RBi and RCi.

Further, in the above-mentioned embodiment, data in the memory cells Ml1 to Mln and Mm1 to Mmn are detected by the inverter type circuit, without using the dummy cells. However, the present invention can be applied to the decoder of dummy cell type.

Figure 23:
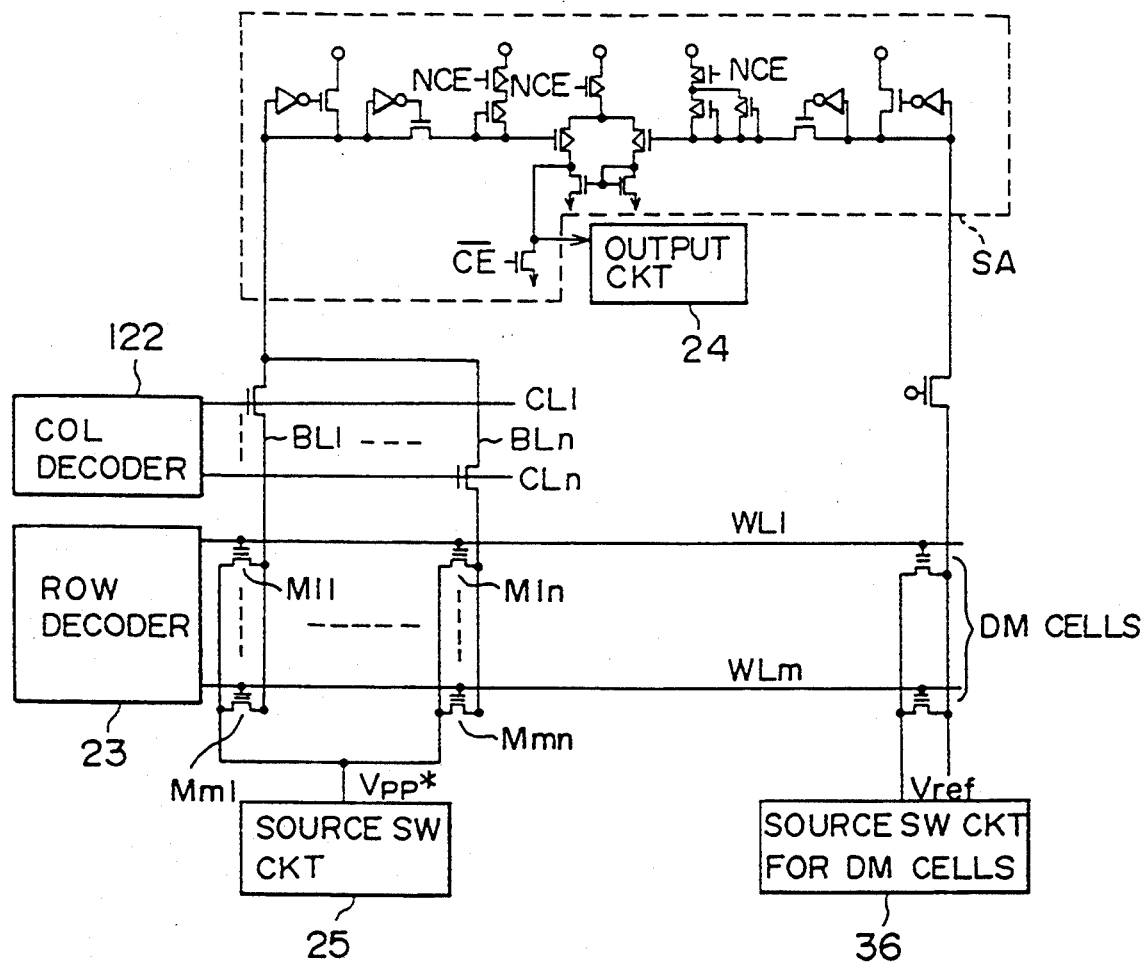
FIG. 23 is a circuit diagram showing another embodiment of the semiconductor memory device according to the present invention.

FIG. 23 is a circuit diagram showing another embodiment of the semiconductor memory device according to the present invention, in which the dummy cells are used. In the drawing, a plurality of transistors are connected as dummy cells DM to the output lines of the row decoder 23; that is, the row lines WL1 to WLn, respectively. The respective sources thereof are connected to a reference output terminal Vref* of a dummy cell source switching circuit 36. Column lines BL1 to BLn selected by the output signal lines CL1 to CLn and a line connected to the dummy cells DM are connected to a sense amplifier SA. The sense amplifier SA outputs a differential signal between the two to an output circuit 24. When data are rewritten, it is unnecessary to erase the dummy cells DM. This is because when the dummy cells DM are erased continuously, since the threshold voltage changes, the reference potential for detecting data fluctuates. Therefore, the dummy cell source switching circuit 36 is set to the ground level in the erasure operation in the same way as in the data write and test mode, but biased at about 5 V in the data read operation only.

As described above, in the semiconductor memory device according to the present invention, the sources of the memory cells are set to the ground level to detect the overerased conditions, and to about 5 V in the read operation, so that it is possible to secure the operation margin for the overerased memory cells. In addition, since the erasure operation is effected at the lower threshold voltage, as compared with the conventional method, it is possible to pass a large operational current and thereby to operate the memory cells at higher speed.

Figure 9:
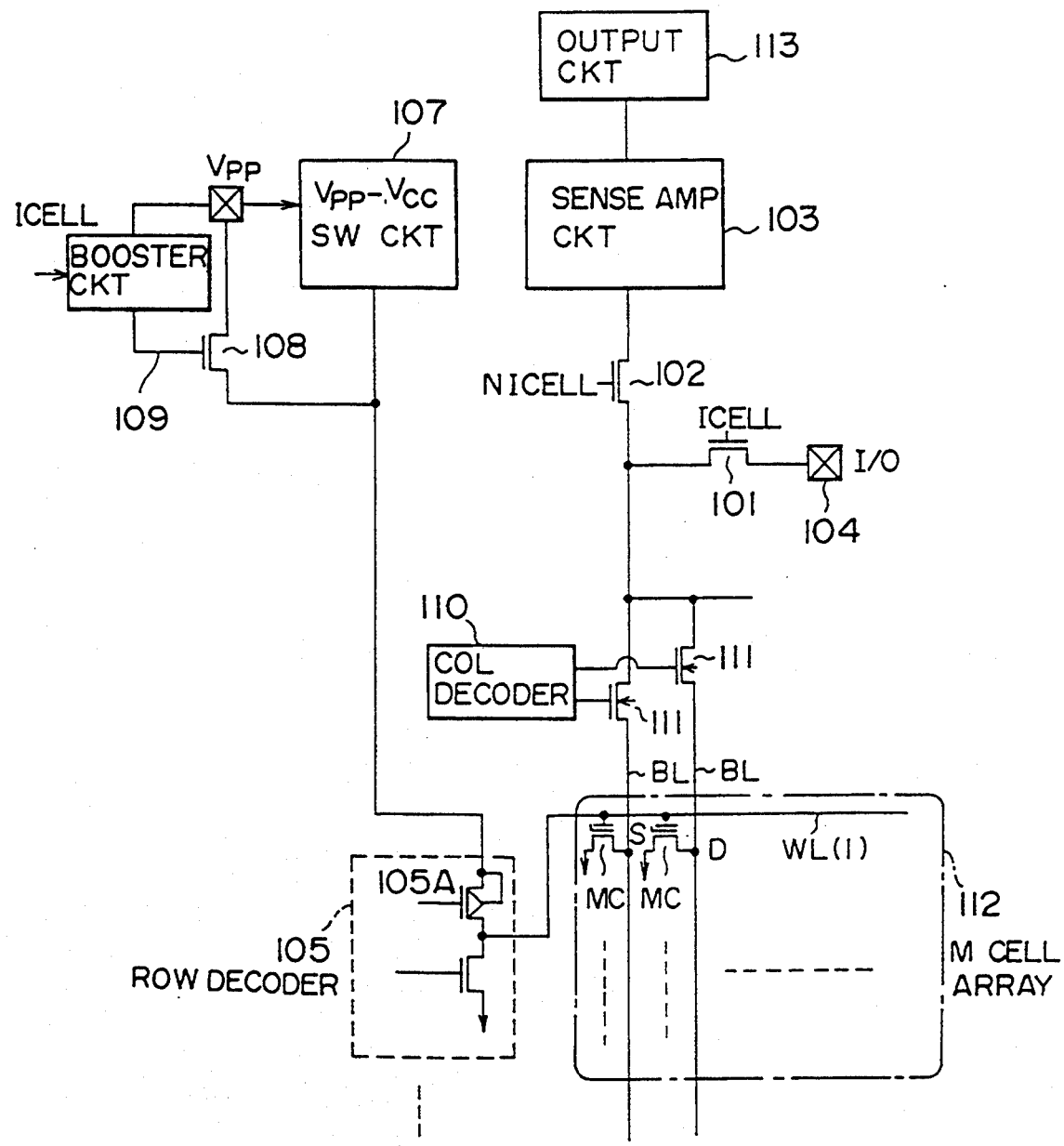
FIG. 9 is a circuit diagram showing another conventional semiconductor memory device.
Figure 10:
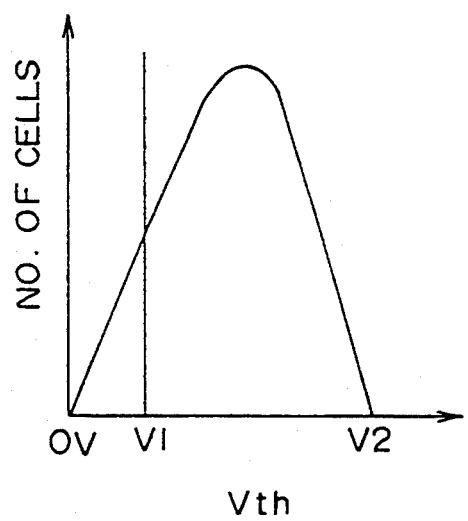
FIG. 10 is a graphical representation showing the threshold voltage distribution after erasure.
Figure 24:
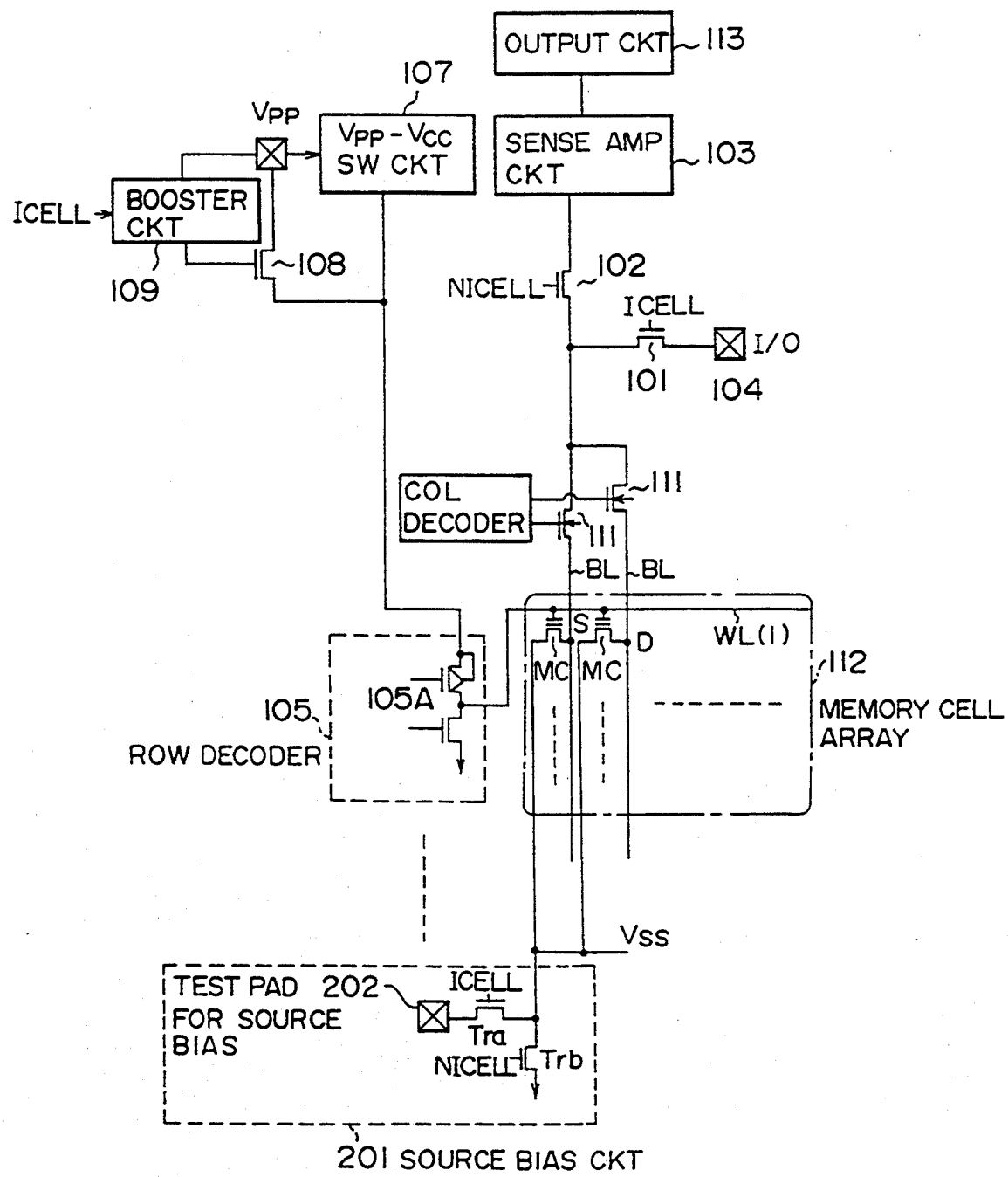
FIG. 24 is a circuit diagram showing another conventional memory device.

FIG. 24 shows another embodiment of the present invention, in which the same reference numerals have been retained for similar parts or elements having the same functions as with the case of the conventional memory device shown in FIG. 9. In FIG. 24, the point different from the conventional device shown in FIG. 9 is that a source bias circuit 201 for applying a bias voltage in measuring the threshold voltage is connected to the sources of the memory cells MC. The source bias circuit 201 is composed of two transistors Tra and Trb. The transistor Tra is connected between a source bias test pad 202 and the sources of the memory cells, and a signal ICELL is applied to the gate thereof. The transistor Trb is connected between the sources Vss* of the memory cells and the ground level Vss, and a signal NICELL is applied to the gate thereof.

In the test mode for measuring the threshold voltage of the memory cells, the signal ICELL is set to "1" level to turn on the transistor Tra and off the transistor Trb. Therefore, the source bias test pad 202 is connected to the sources S of the memory pads MC, so that it is possible to freely bias the source potential through the external source pad 202.

The effect of applying a bias voltage to the sources as described above will be described hereinbelow. In general, when a voltage is applied to the source of a transistor, the threshold voltage is shifted in the forward direction. This phenomenon is known as substrate effect which is extremely important from the design standpoint. In more detail, under the condition that the substrate is biased in the reverse direction to the source, since the depletion layer between the substrate and the channel is widened, the quantity of the electric charge also increases. Accordingly, the electric field at the gate required to form the channel also increases, so that the threshold voltage increases apparently.

Figure 25:
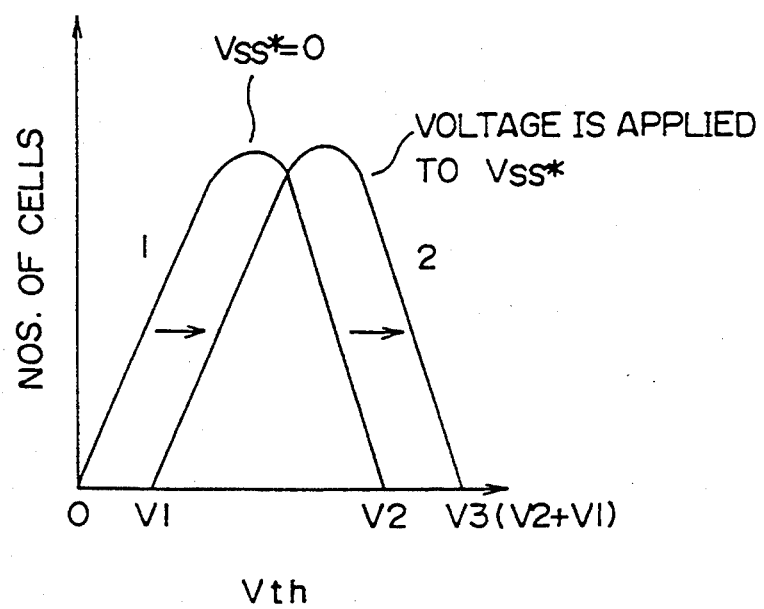
FIG. 25 is a graphical representation showing the threshold voltage distribution of the conventional memory device shown in FIG. 24.

On the basis of the effect as described above, when a voltage is applied to the sources of the memory cells, it is possible to shift the distribution characteristics of the threshold voltage-as shown by (1) to those as shown by (2) in FIG. 25, in which 0 V threshold voltage is shifted to V1 (V) and V2 (V) threshold voltage is shifted to V3 V, respectively.

In other words, when the lowest threshold voltage in the distribution is shifted to the value higher than the threshold V1 (V) of the P channel transistor, it is possible to accurately measure the threshold voltage distribution by changing the external supply voltage Vpp; that is, by changing the word Lines of the memory cells according to the external supply voltage Vpp. Therefore, if the threshold voltage of the memory cell is depleted deep in the negative direction, it is possible to measure any threshold voltage by changing the voltage applied to the source thereof.

In this measurement, when the dependency characteristics of the threshold voltage upon the source voltage of the memory cell transistors such as TEG (the same in size as the actual transistors) are previously measured, it is possible to measure the threshold distribution by shifting it by a predetermined voltage; that is, to measure the threshold voltage distribution of the overerased memory cells.

Here, it should be noted that the voltage applied between the drain and the source of the memory cells must be kept at a constant value when the threshold voltage is measured. For instance, when 1 V is applied to an I/O pad 104 (FIG. 24) and 1 V is applied to the drain of the memory cells, the voltage difference between the drain and the source is 1 V when the source voltage is 0 V. Under these conditions, when 1 V is applied to the source, the voltage difference between the drain and the source is 0 V. Therefore, no current flows through the memory cell, so that the threshold voltage cannot be measured. In other words, when the source voltage is 1 V, for instance, it is necessary to set the drain at 2 V to obtain a constant voltage difference between the drain and the source.

Figure 26A:
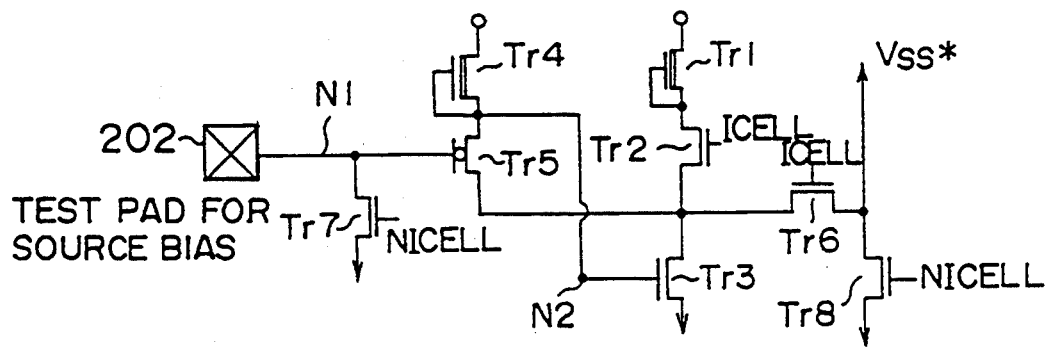
FIGS. 26A and 26B are more practical circuit diagrams showing parts of the memory device shown in FIG. 24.

Another embodiment of the source bias circuit will be described hereinbelow with reference to FIGS. 26A and 26B. In FIG. 26A, a voltage is applied to the sources of the memory cells by use of an internal circuit, without directly connecting the source bias test pad to the sources of the memory cells. In the test mode, when the signal ICELL is set to "1" transistors Tr2 and Tr6 are turned on and transistors Tr7 and Tr8 are turned off, so that the potential at a node N1 is determined by the potential applied to the source bias test pad. Further, the potential at a node N2 drops down to roughly the ground level, because the gate voltage of the transistor Tr5 is at an intermediate level. Here, the gm (mutual conductance) of the transistor Tr4 is determined to be smaller than that of the transistor Tr5. Further, since the transistor Tr2 is on, the potential at the terminal Vss, rises through the transistor Tr1. When the Vss* potential rises beyond that at the node N2, the transistor Tr3 is turned on, so that the further rise in potential at Vss* can be suppressed. On the other hand, when the potential at Vss* drops below a predetermined level, the Vss* potential is charged through the transistor TR1. Further, it is possible to set the Vss* potential at any desired level by changing the potential at the source bias test pad to any given value.

Figure 26B:
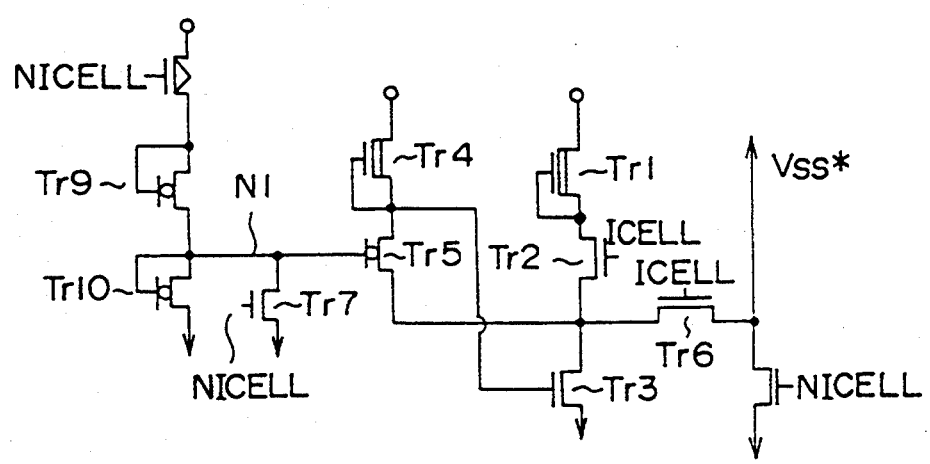

FIG. 26B shows still another source bias circuit, in which the point different from the, circuit shown in FIG. 26A is that an internal circuit is used to determine the potential at the node N1. In this example, it is possible to determine the Vss* potential at any given value, by changing the gms of transistors Tr9 and Tr10 appropriately.

As described above, in the threshold value measurement of the present invention, the threshold voltages of the overerased memory cells can be measured by applying the source voltage to the memory cells, thus facilitating the evaluation in the reliability of the memory cell LSIs.

The embodiments of the present invention have been described by taking the case of EEPROM. Without being limited thereto, however, the present invention can be of course applied to EPROM.

Still another embodiment will be described hereinbelow, in which the erasure verify voltage level to be applied to the word lines is controlled according to the distribution width of the threshold values of the memory cells in the erasure measurement operation.

This embodiment will be described in further detail hereinbelow in relation to the conventional example.

Conventionally, when an electrically rewritable EEPROM (NOR-type) is erased (electrons are extracted from the floating gate), the threshold voltages inevitably disperse due to the dispersion caused during the manufacturing process of the memory cells. Therefore, the erasure operation has been so far effected until the memory cell lowest in erasure speed in a chip can be erased, because there exists the dispersion or distribution between the memory cell of the highest erasure speed and the memory cell of the lowest erasure speed.

In this case, when the chip memory cells having a wide threshold distribution are erased, the threshold value of the memory cell of the highest erasure speed becomes negative and thereby always turned on, thus causing an erroneous operation. Therefore, the erasure discrimination level is determined to be slightly wider than the threshold distribution width of the memory cells under consideration of the manufacturing dispersion. For instance, when the threshold distribution width is 2.5 V and the dispersion thereof is 0.5 V, the distribution width is determined to be 3 V. In this case, the erasure discrimination threshold level is set to 3 V. As described above, the erasure discrimination level is determined under the worst condition under consideration of the manufacturing dispersion. Therefore, even in the case of the manufacturing lot of the memory cells of a narrow threshold distribution, the upper limit of the erased memory cell becomes the same threshold value of the worst lot.

Figure 29:
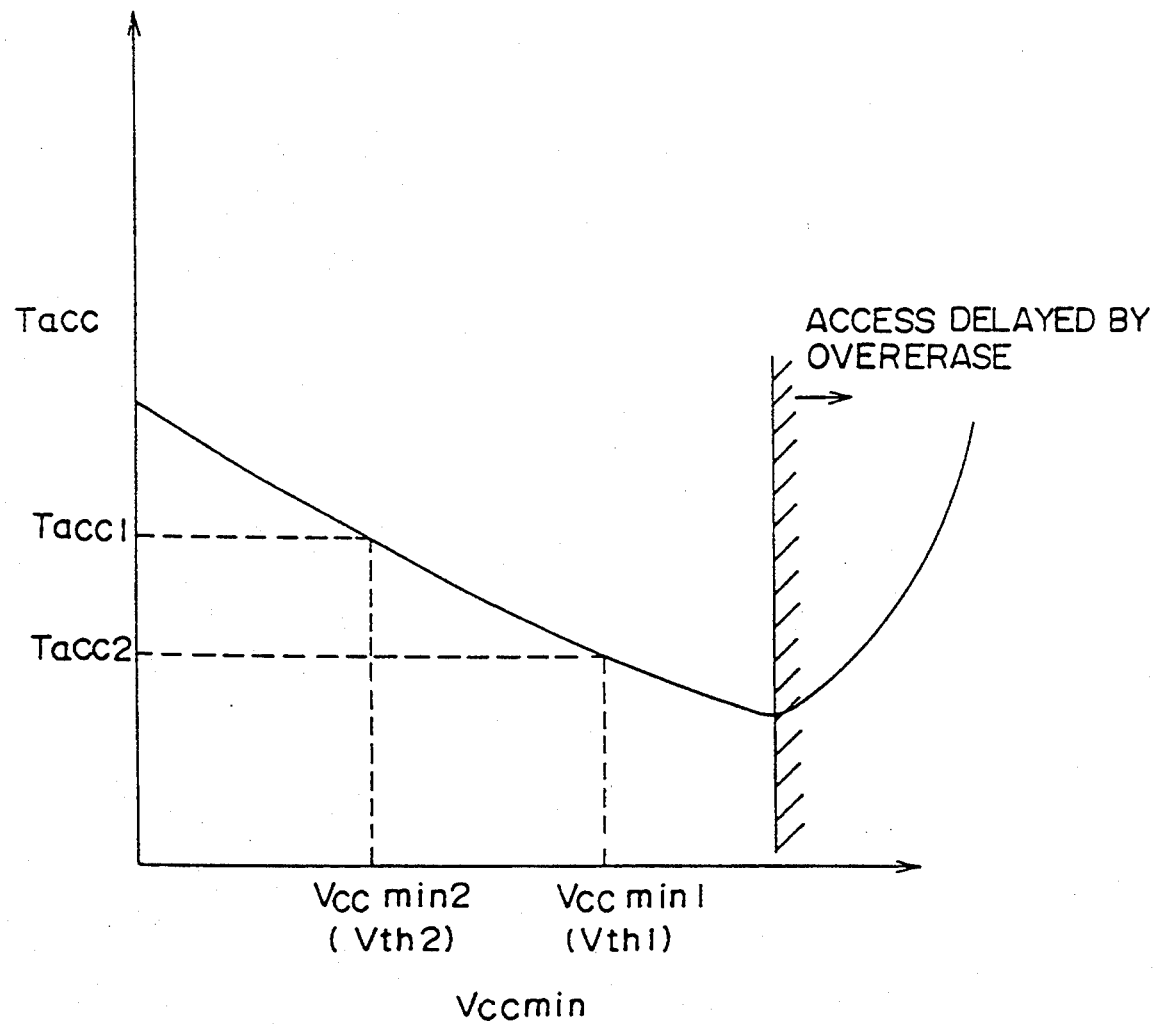
FIG. 29 is a graphical representation showing the relationship between the threshold voltage and the access time.

In general, the access time of the memory cells of the LSI is closely related to the threshold level of the cells, as shown in FIG. 29. That is, since the cell current increases with the decreasing threshold voltage, the operational speed increases. Therefore, in the conventional method, only the access samples of the erasure level determined at the worst conditions are manufactured.

With these problems in mind, in the present embodiment, the feature resides in that in the case of the manufacturing lot of narrow threshold distribution width, it is possible to erase the memory cells of lower threshold voltage by erasing the memory cell of the highest erasure speed to such an extent that no leak current flows, thus decreasing the threshold level and increasing the access speed.

Figure 27:
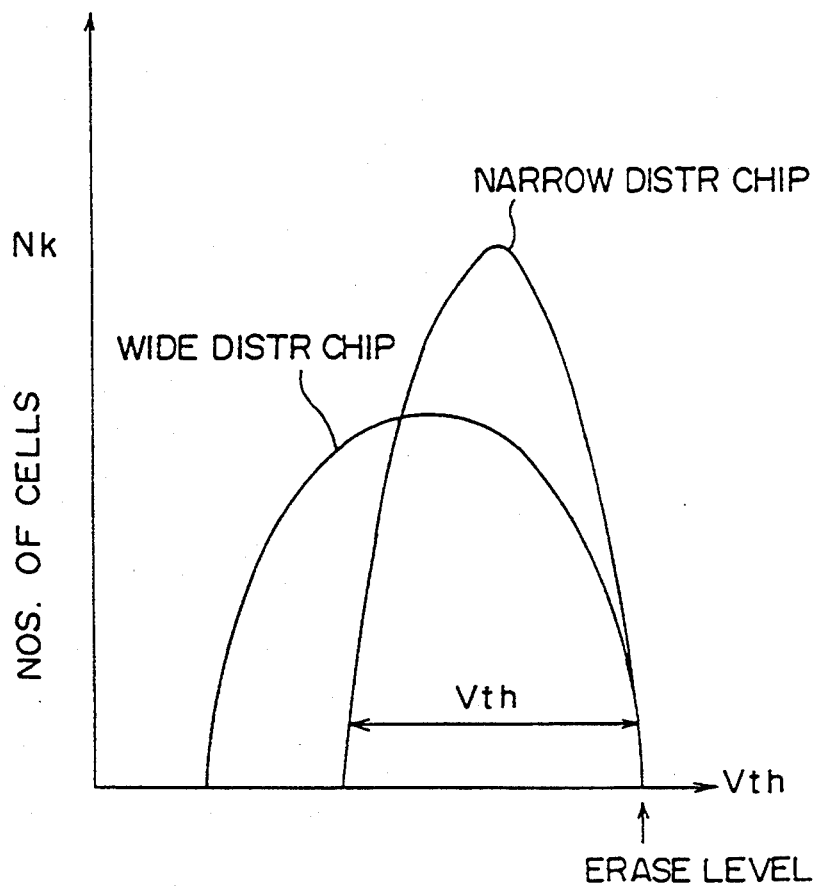
FIG. 27 is a graphical representation showing the threshold voltages of the conventional erasing method.
Figure 28:
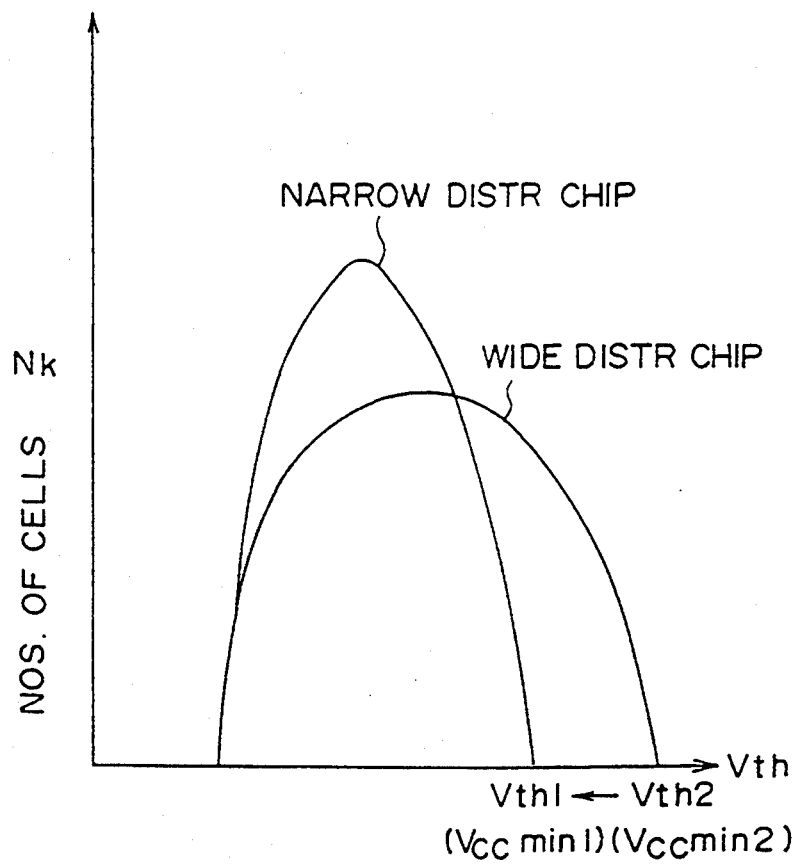
FIG. 28 is a graphical representation showing the threshold voltages of the embodiment of the present invention.

In the present invention, when there exists a chip having a narrow distribution width $V_{th}$ as shown in FIG. 27, the threshold voltage is lowered by defining the lower limit of the narrow distribution width $V_{th}$ as shown in FIG. 28. Therefore, as shown in FIG. 29, it is possible to improve the access time Tacc. That is, during the die (chip) sorting, the distribution width $V_{th}$ is monitored, and the erasure is effected by changing the erasure level according to the distribution width, in such a way that it is possible to obtain a higher access speed for the manufacturing lot of a narrower threshold distribution width, as compared with the conventional method.

Figure 30:
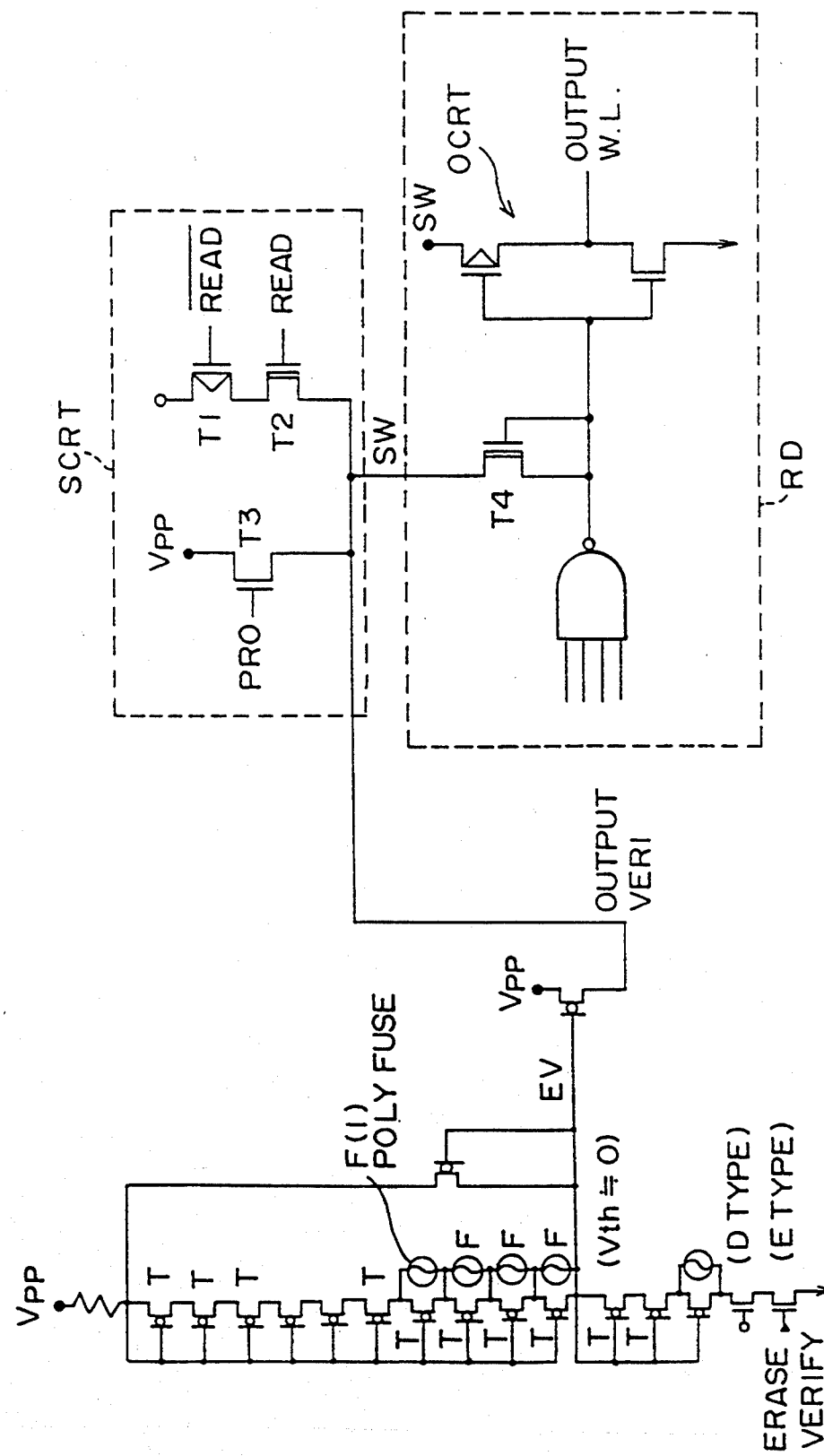
FIG. 30 is a circuit diagram showing a circuit for setting the word line level in the erasure verify operation.
Figure 31A:
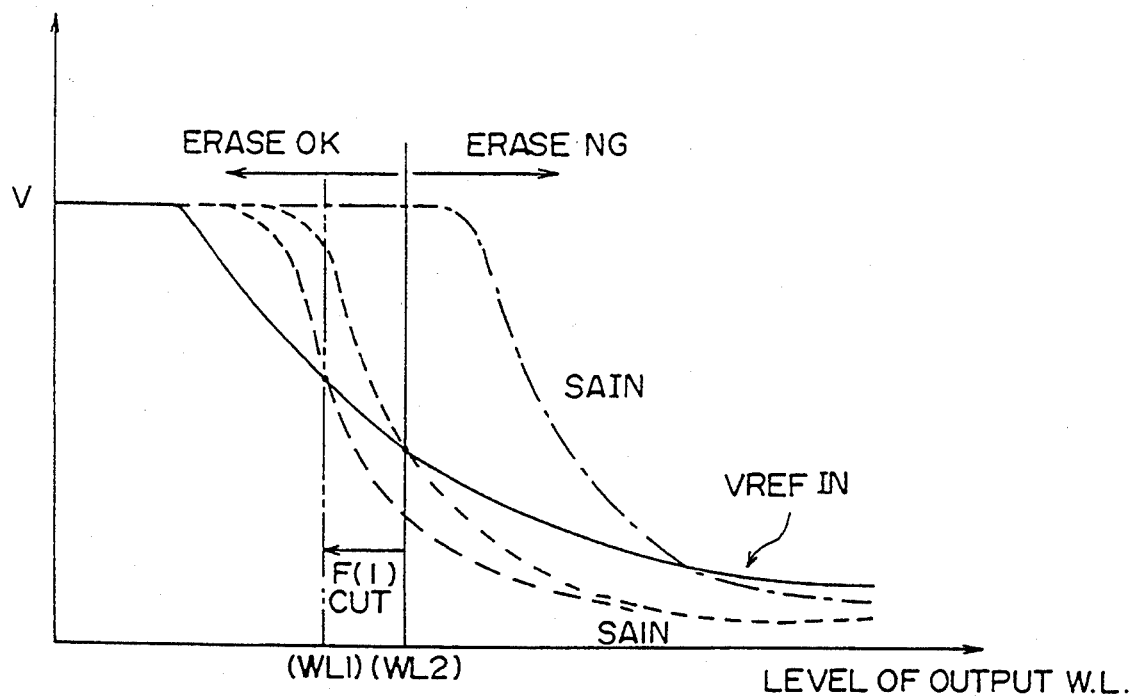
FIGS. 31A and 31B are diagrams showing nodes in the sense amplifier in erasure verify operation.
Figure 31B:
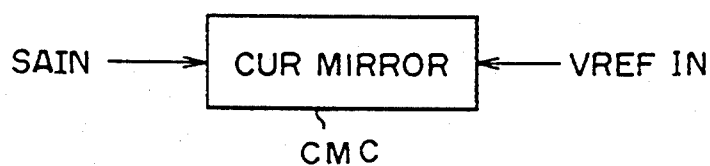

To detect whether the erasure has been achieved, the output level Veri of a level setting circuit as shown in FIG. 30 is lowered to erase the memory cell, and the output SAIN of the memory cell is compared with a reference voltage VREFIN by a current mirror circuit CMC as shown in FIG. 31(b), for instance. FIG. 31(a) shows the operation thereof. The erasure level can be set freely by changing the Level of the output Veri of the level setting circuit as shown in FIG. 30. In more detail, in the erasure setting circuit shown in FIG. 30, poly fuses, for instance are connected to some of load transistors T and the level of an output W.L. is changed by melting off some of the fuses, so that it is possible to freely change the level of the output W.L. For example, the assumption is made that the level of the output W.L. is set to WL2 in erasure mode. In the case of the chip of a narrower distribution width, if the fuse F(1) is brown off in FIG. 30, the level of the output W.L. changes from WL2 to WL1, so that it is possible to effect the erasure at a lower threshold voltage to increase the access speed.

Further, as understood in FIG. 30, the output Veri is connected to the upstream side of a transistor T4 via a switching circuit SCRT. The switching circuit SCRT is provided with transistors T1 and T2 turned on in read mode and a transistor T3 turned on in program mode. All these transistors T1 to T3 are turned off in verify mode. The output of the row decoder RD is outputted as the output W.L. via an output circuit OCRT.

The device configuration using dummy cells will be described hereinbelow in detail.

Figure 32:
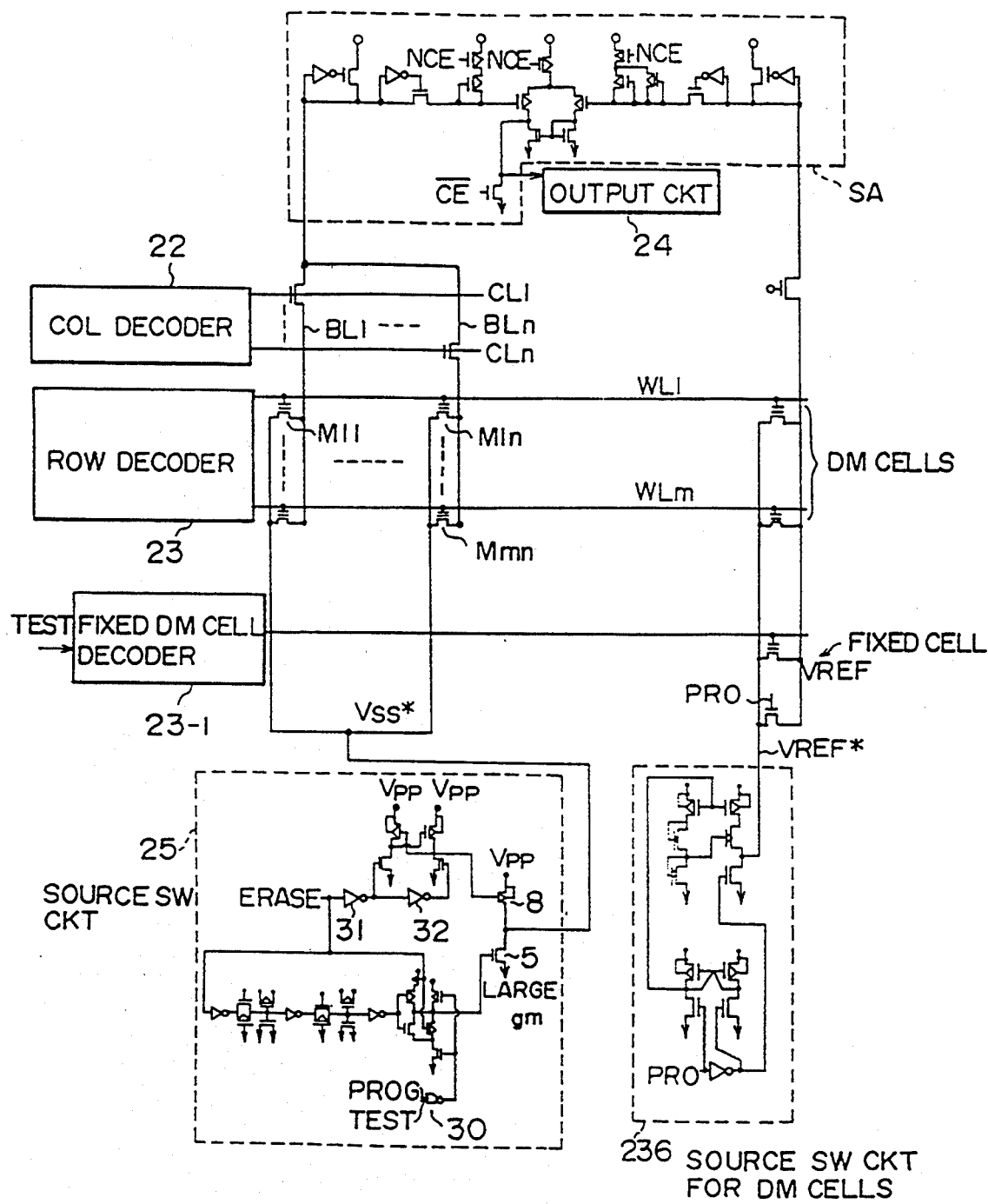
FIG. 32 is a diagram showing an embodiment of the semiconductor memory device according to the present invention.

FIG. 32 is a circuit diagram showing an embodiment of the semiconductor memory device of this type according To the present invention.

In FIG. 32, a plurality of transistors or dummy cells DM are connected to the output lines or row lines WL1 to WLm of the row decoder 23. The respective sources of the dummy cells are connected to a reference output terminal Vref* of a dummy cell source switching circuit 236. Column lines BL1 to BLn selected by output signal lines CL1 to CLn and a line connected to the drains of the dummy cells DM are connected to a sense amplifier SA, to output a differential signal between the two to an output circuit 24. Further, a fixed cell used for the overerase test is connected to one end of a dummy column line vref. The gate of this fixed cell is connected to the output of a fixed dummy cell decoder 23-1 selected in the test mode. The reason is as follows: in the overerase test mode, since all the row lines WL1 to WLn are set to the non-selected status (0 V), the gates of the dummy cells DM are at 0 V and thereby the dummy cells are turned off. That is, when the dummy cells are turned off, since the reference potential cannot be set, it is impossible to conduct test correctly.

In the data rewrite mode, it is unnecessary to erase data from the dummy cells DM. This is because when the dummy cells DM are erased continuously, since the threshold voltage changes, the reference potential for data detection fluctuates. Further, in the case of the dummy reference method, a high voltage (12 V) applied to the row lines to write data in the memory cells of the device is also applied to the gates of the dummy cells. Therefore, since electrons are injected gradually into the floating gates of the dummy cells, the threshold voltages rise gradually, so that it is impossible to secure a stable cell operation (referred to as gate disturbance).

To overcome this problem, in the present embodiment, a dummy cell source switching circuit 236 is provided to reduce the electric field applied to the gates and the substrate in write mode. That is, in the write mode, the dummy cell source switching circuit 236 outputs a voltage of about 3 V to the sources and the drains of the dummy cells. Therefore, the electric field applied to the gates and the substrates can be reduced by 3 V to prevent the gate disturbance.

As described above, in the semiconductor memory device according to the present invention, when the overerased status is tested, since another fixed cell different from the dummy cells used to read data is selected; that is, another cell provided with the characteristics equivalent to those of the dummy cells of the device itself is used, it is possible to secure an operational margin.

Figure 33:
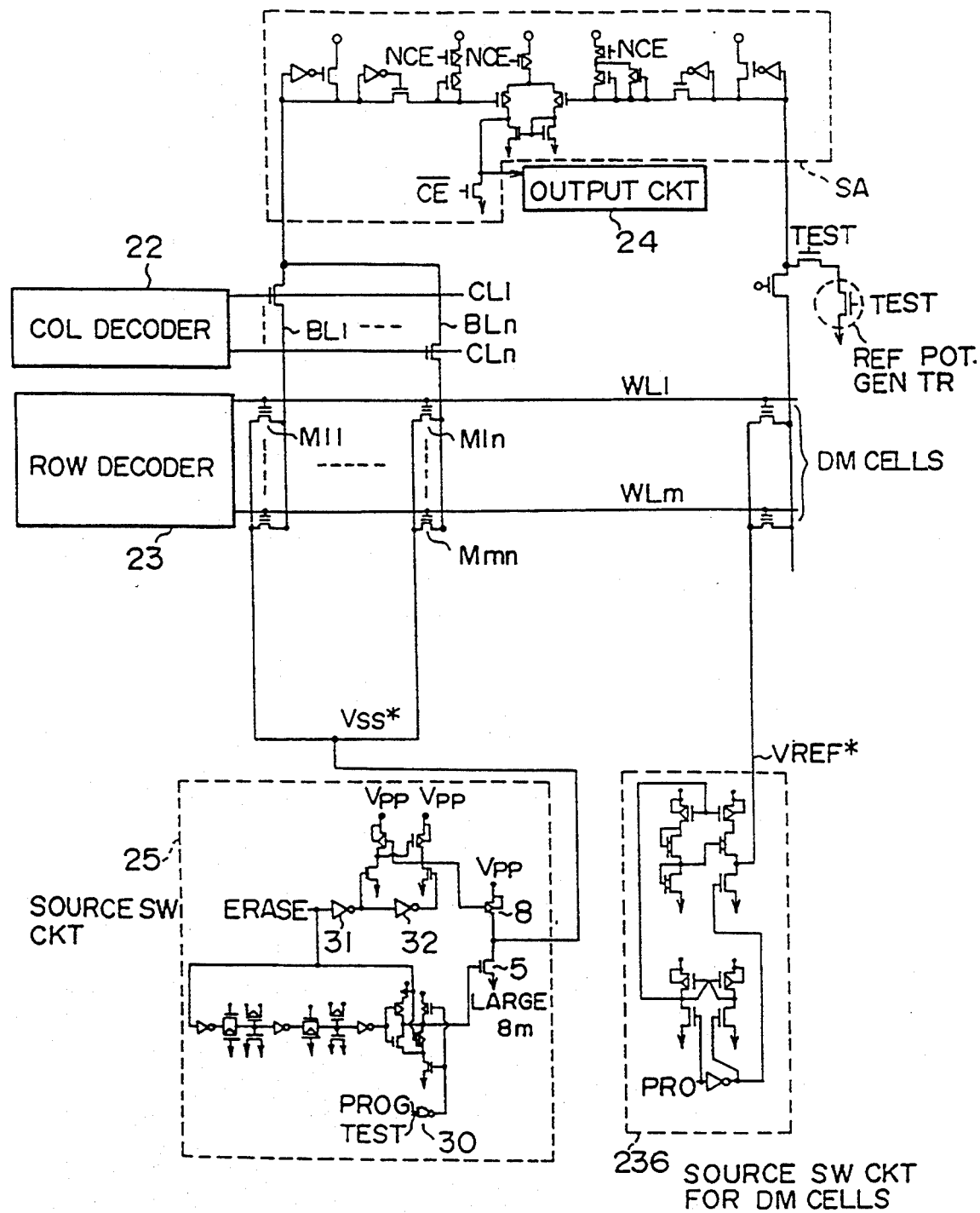
FIG. 33 is a diagram showing an embodiment of the semiconductor memory device according to the present invention.

FIG. 33 shows still another embodiment of the present invention, in which the same reference numerals have been retained for the similar parts or elements which have the same functions as with the case of the embodiment shown in FIG. 32. The point different between the two is, that a reference voltage generating transistor is provided in addition to the memory cell array, without using the fixed cell of the shape the same as the device memory cells. In this embodiment, the reference potential can be determined freely by setting the dimensions of the reference voltage generating transistor. In other words, since the reference potential can be adjusted in the overerase test, it is possible to determined the margin for the amount of leak.

Figure 34A:
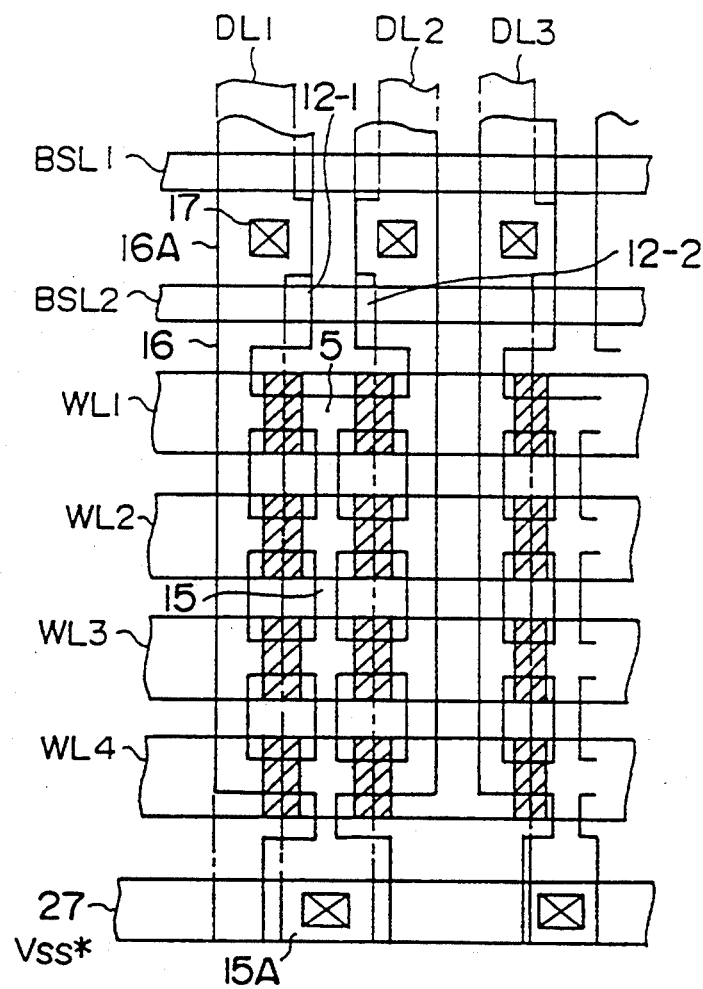
FIG. 34 is a diagram showing the memory cells of another embodiment of the semiconductor memory device according to the present invention.
Figure 34B:
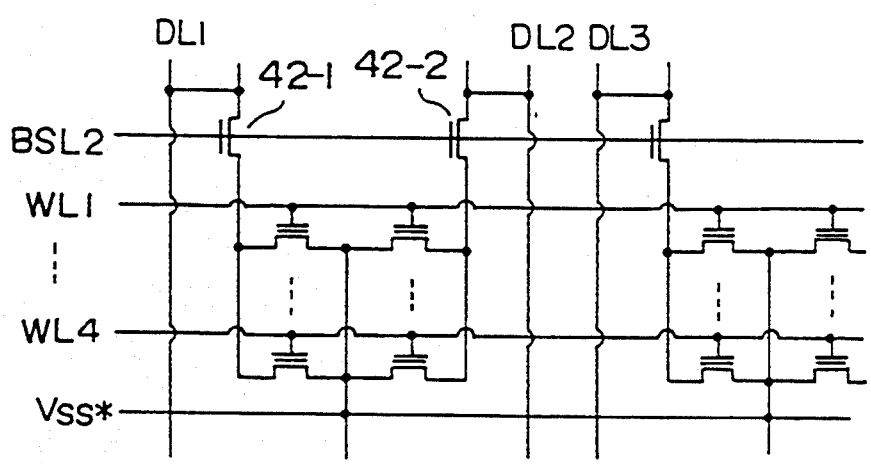

The above-mentioned overerase test can be made by use of the memory cells as shown in FIG. 34, in which the plane view and the equivalent circuit thereof are shown together. Further, in FIG. 34, four row lines are included for each block by way of example. Without being limited thereto, it is of course possible to use 8 or 16 row lines in the same way as shown. Further, a single data line (e.g., DL1) is connected to four memory cells through a block select transistor 42-1. In particular, the feature of the layout shown in FIG. 34 is that the common drains 16 of these four memory cells are connected to each other by only a diffusion layer, without contact with an aluminum wire. The common drain 16 is connected to a diffusion layer 16A via the clock select transistor 42-1. The diffusion layer 16A is connected to a data line DL (aluminum wire) via a contact 17. Therefore, only one contact 17 is provided for 8 transistors of both the upper and lower blocks. In other words, since the number of the contacts can be reduced by ¼, the pattern size can be reduced effectively. Further, the respective sources 15 of the memory cells are connected in common via a diffusion layer 15A, and further connected to a Vss line 27 through the contacts 17.

The operation of the memory cells as described above will be described hereinbelow. In the case of this memory cells, the concept of erasure of the memory cells is defined as that the threshold level is high, being different from the other embodiments. The reason is as follows: when data is written in a cell of a low threshold level, the threshold levels of all the cells are set to a higher level to selectively extract electrons from the floating gates, for prevention of gate disturbance.

In more detail, in the erasure operation, the select line BSL of a block including the memory cell to be rewritten is set to "L", so the block transistors 42-1 and 42-2 are turned off into the floating gate status. Under these conditions, the source line Vss is set to the ground level (0 V) and the row line in the block is set to 20 V, to inject electrons into the floating gate. At this time, since the injection of electrons into the floating gate is effected on the F-N mechanism, almost no current flows through the cell. As described above, the threshold levels of all the memory cells are increased by injecting electrons into the floating gates of the memory cells.

In the data write operation, electrons are selectively extracted from the floating gate of the memory cell. The row line of the memory cells to be written is set to 0 V and the row lines other than the above are set to 10 V. The reason why 10 V is applied to the non-selected row lines is as follows: when data is written by applying a high voltage to the drain, since the high voltage is applied to all the drains of the memory cells within the same block, it is necessary to reduce the electric field between the drain and gate. Under these conditions, a high voltage of about 20 V is applied to the drain of the memory cell in which data is required to be written, in order to extract electrons from the floating gate. Therefore, the threshold level of this memory cell is reduced. On the other hand, in the memory cells whose drains are kept at 0 V, since electrons are not emitted from the floating gates, the erased status is maintained.

In the data read operation, 5 V is applied to the gates of the block select transistors 42-1 and 42-2 of the block from which data are required to read, in order to select the block. Further, 5 V is applied to a line WL of the selected block. In this case, when the threshold level is sufficiently high, the memory cell is turned off without passing current. However, when the threshold level is low, the memory cell is turned on to pass current therethrough. The current flowing condition can be detected by the sense amplifier. FIG. 35 lists the voltage conditions in the above-mentioned operations.

In the memory cells as described above, since electrons are extracted from the floating gate in the data write operation, there exists a problem with respect to an overwrite during the data write operation, in the same way as with the case of the overerasure in the erasing operation of the first embodiment. Therefore, after data have been written, it is necessary to effect an overprogram test as to whether the memory cells are depleted or not.

FIG. 36 shows a circuit configuration of the semiconductor memory device using the memory cells of the above-mentioned type, in which an inverter type sense amplifier circuit is incorporated. In the overprogram test, all the block select transistors 42-1 and 42-2 are selected to set all the row lines WL1 to WLm to the non-selected status. Under these conditions, data are read by selecting the column select transistors (Tr1 to Trn) in sequence by the column decoder 22. When an overprogrammed memory cell does not exist, since no current flows, "0" data is outputted in contrast with this, when an overprogrammed memory cell exists, since current flows, "1" data is outputted, so that it is possible to detect the presence or absence of an overprogrammed cell. In this test mode, the column select transistors can be selected simultaneously. Further the jest can be made in the unit of block or for all the blocks simultaneously.

The inverter type configuration which uses no dummy cells as the standard cells for data detection has been explained. Here, the configuration which uses dummy cells will be described.

Figure 37:
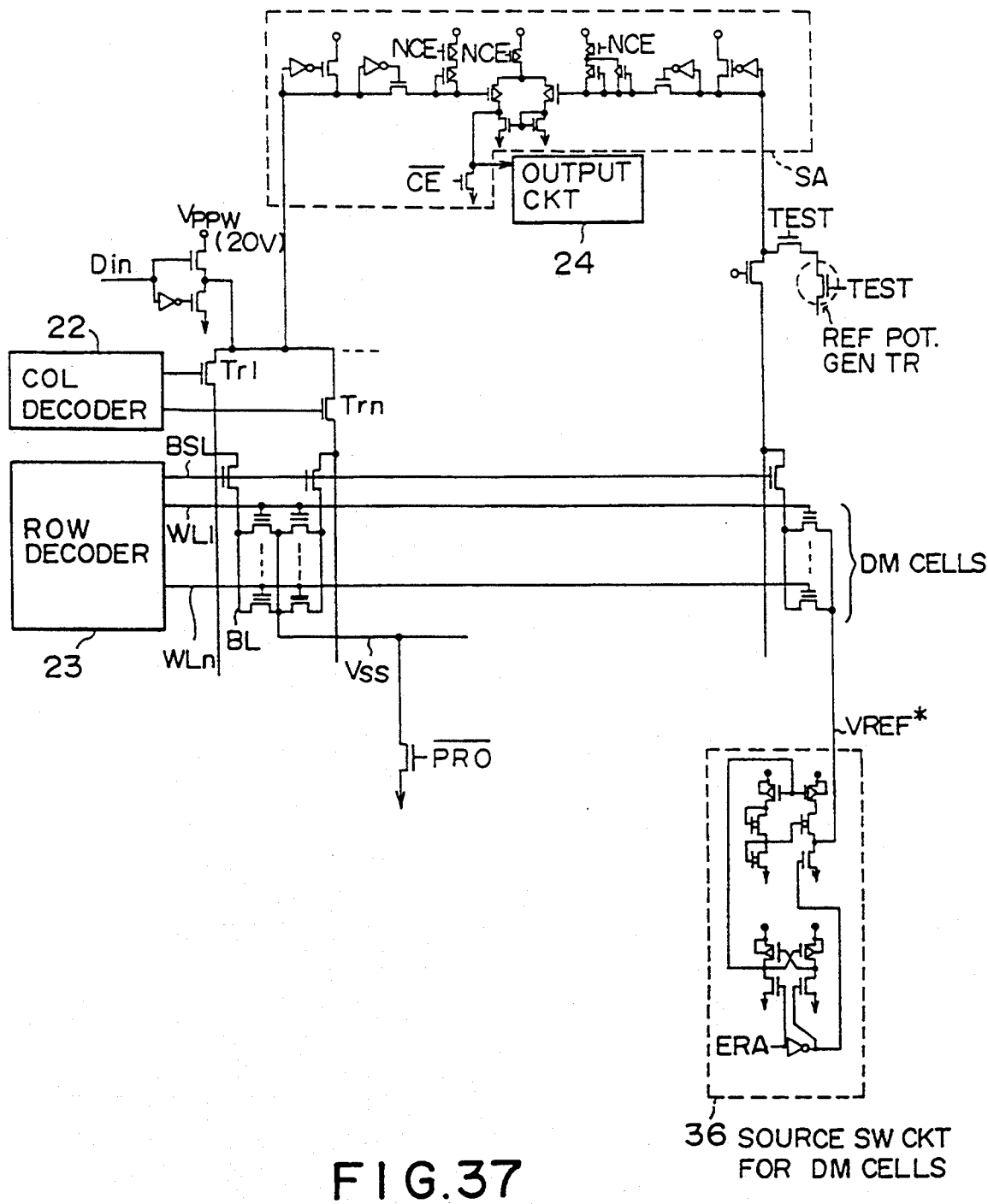
FIG. 37 is a diagram showing an embodiment of the semiconductor memory device according to the present invention.

FIG. 37 is a circuit diagram showing the semiconductor memory device related to another embodiment of the present invention. In FIG. 37, a plurality of transistors or dummy cells DM are connected to the output lines or row lines WL1 to WLm of the row decoder 23. The respective sources of the dummy cells are connected to a reference output terminal Vref* of a dummy cell source switching circuit 36. Column lines BL1 to BLn selected by output signal lines CL1 to CLn and a line connected to the drains of the dummy cells DM are connected to a sense amplifier SA, to output a differential signal between the two to an output circuit 24. Further, a reference potential generating transistor used for overprogram test is connected in addition to the memory cell array. The reason is as follows: in the overprogram test mode, since all the row Lines WL1 to WLn are set to non-selected status (0 V), the gates of the dummy cells DM are at 0 V and thereby the dummy cells are turned off. That is, when the dummy cells are turned off, since the reference potential cannot be set, it is impossible to conduct test correctly.

in the data rewrite mode, it is unnecessary to test the dummy cells DM. Further, in the dummy Vref of this type, a high voltage (20 V) applied to the row lines to initialize the memory cells in the device is also applied to the gates of the dummy cells, so that since electrons are injected gradually into the floating gates of the dummy cells DM, the threshold voltages rise gradually, so that it is impossible to secure a stable cell operation (referred to as gate disturbance).

To overcome this problem, in the present embodiment, a dummy cell source switching circuit 36 is provided to reduce the electric field applied to the gates and the substrate in erasure mode. That is, in the erasure mode, the dummy cell source switching circuit 36 outputs a voltage of about 3 V to the sources and the drains of the dummy cells. Therefore, the electric field applied to the gates and the substrates can be reduced by 3 V to prevent the gate disturbance. In the present invention, a reference voltage generating transistor is provided in addition to the memory cell array, without using the fixed cell of the shape the same as the device memory cells. Therefore, the reference potential can be determined freely by setting the dimensions of the reference voltage generating transistor. In other words, since the reference potential can be adjusted in the overerase test, it is possible to determined the margin for the amount of leak.

In the above-mentioned embodiments, the reference potential applied to the differential amplifier in the data read operation is generated by the floating gate type transistor. Without being limited thereto, however, various circuits can be adopted for this purpose. For instance, a predetermined reference potential can be obtained by dividing a supply voltage by resistances. Further, in the embodiments using the dummy cells, since the dummy cell transistor can be formed at the same region (in which the memory cells are formed) during the same process, it is possible to eliminate the difference in performance between the memory cells and the dummy cell transistors, thus providing such an effect that an erroneous data read operation can be prevented even if the substrate potential fluctuates due to noise, for instance.

In addition, in the above-mentioned embodiments, the column line voltage is compared with the reference potential in the test mode with the use of the reading differential sense amplifier. Without being limited thereto, however, various means can be adopted, for instance such as by using another detecting circuit, as far as a voltage drop in the column line can be detected.

What is claimed is:

1. A non-volatile semiconductor memory device, comprising:
    a memory cell array having a plurality of data erasable, writable and readable non-volatile memory cells, data read from the respective memory cells being transmitted to a common bit line through respective bit lines;
    memory cell selecting means for selecting any one of or any of the memory cells according to an input address to enable data erasure, data writing in a data write mode and data reading in a data read mode;
    dummy cell means for outputting a read reference voltage to detect whether data read from the selected memory cell to the common bit line through the respective bit line is a high level or a low level in said data read mode;
    test means for outputting a test reference voltage to discriminate whether a potential at the common bit line is the high level or the low level in a test mode in which no memory cells are selected; and
    a differential sense amplifier for comparing the potential at the common bit line with the read reference voltage or with the test reference voltage and outputting a signal indicative of a comparison result in the read mode and the test mode.

2. The non-volatile semiconductor memory device of claim 1, wherein each of the respective memory cells arranged roughly in a matrix pattern is a transistor having a source, a drain, a floating gate and a control gate so as to enable the memory cell to write and erase data electrically, the gates of the memory cells arranged in a same row line being connected to a same word line and the drains of the memory cells arranged in a same column line being connected to a same bit line and the bit lines being connected commonly to the common bit line.

3. The non-volatile semiconductor memory device of claim 2, wherein said dummy cell means is composed of dummy cells arranged in one-column direction, each of the dummy cells being a transistor having the same structure as the memory cell and having a control gate connected in common to the corresponding respective word line and a drain connected to one dummy column line connected to one input terminal of said differential sense amplifier.

4. The non-volatile semiconductor memory device of claim 3, wherein said test means includes test reference voltage generating means for generating the test reference voltage and driving means for activating said test reference voltage generating means.

5. The non-volatile semiconductor memory device of claim 4, wherein said test voltage generating means is a transistor having the same structure as the memory cell, for outputting the test reference voltage when said driving means applies a select signal to a control gate of said test reference voltage generating means.

6. The non-volatile semiconductor memory device of claim 5, wherein said driving means is a decoder for outputting the select signal in response to a test signal.

7. The non-volatile semiconductor memory device of claim 6, which further comprises dummy cell stress reducing means for applying a voltage to reduce stress of the dummy cells to the sources of the dummy cells in said data write mode.

8. The non-volatile semiconductor memory device of claim 7, wherein two source voltages generated by two different source voltage supplying means are applied to the sources of the memory cells and the sources of the dummy cells, respectively.

9. The non-volatile semiconductor memory device of claim 5, wherein the transistor of said test reference voltage generating means is formed in the vicinity of and as a part of said memory cell array.

10. The non-volatile semiconductor memory device of claim 5, which further comprises dummy cell stress reducing means for applying a voltage to reduce stress of the dummy cells to the sources of the dummy cells in said data write mode.

11. The non-volatile semiconductor memory device of claim 10, wherein two source voltages generated by two different source voltage supplying means are applied to the sources of the memory cells and the sources of the dummy cells, respectively.

12. The non-volatile semiconductor memory device of claim 4, wherein said test reference voltage generating means is a transistor having a source, a drain and a control gate; and said driving means applies a select signal to the control gate of said test reference voltage generating means, the drain of said test reference voltage generating means being connected to the dummy column line.

13. The non-volatile semiconductor memory device of claim 12, wherein the transistor of said test reference voltage generating means is formed externally from and irrespective of said memory cell array.

14. The non-volatile semiconductor memory device of claim 12, wherein the transistor of said test reference voltage generating means is formed externally from and irrespective of said memory cell array.

15. The non-volatile semiconductor memory device of claim 4, which further comprises dummy cell stress reducing means for applying a voltage to reduce stress of the dummy cells to the sources of the dummy cells in said data write mode.

16. The non-volatile semiconductor memory device of claim 15, wherein two source voltages generated by two different source voltage supplying means are applied to the dummy cells, respectively.

17. The non-volatile semiconductor memory device of claim 3, which further comprises a plurality of switching means interposed between the respective column lines and the common column line in such a way that any number of said switching means are selectively turned on.

18. The non-volatile semiconductor device of claim 17, wherein said switching means are turned on or off by a column decoder.

19. The non-volatile semiconductor memory device of claim 18, which further comprises dummy cell stress reducing means for applying a voltage to reduce stress of the dummy cells to the sources of the dummy cells in said data write mode.

20. The non-volatile semiconductor device of claim 17, wherein said switching means are turned on one by one to selectively connect one of the column lines to the common column line for discrimination of the respective column lines individually by said differential sense amplifier.

21. The non-volatile semiconductor memory device of claim 20, which further comprises dummy cell stress reducing means for applying a voltage to reduce stress of the dummy cells to the sources of the dummy cells in said data write mode.

22. The non-volatile semiconductor memory device of claim 17, which further comprises dummy cell stress reducing means for applying a voltage to reduce stress of the dummy cells to the sources of the dummy cells in said data write mode.

23. The non-volatile semiconductor memory device of claim 3, which further comprises dummy cell stress reducing means for applying a voltage to reduce stress of the dummy cells to the sources of the dummy cells in said data write mode.

24. The non-volatile semiconductor memory device of claim 23, wherein two source voltages generated by two different source voltage supplying means are applied to the sources of the memory cells and the sources of the dummy cells, respectively.

25. The non-volatile semiconductor memory device of claim 23, wherein an output of said dummy stress reducing means is also applied to the source of the transistor of said test reference voltage generating means.

26. The non-volatile semiconductor memory device of claim 2, wherein said test means includes test reference voltage generating means for generating the test reference voltage and driving means for activating said test reference voltage generating means.

27. The non-volatile semiconductor memory device of claim 26, wherein said test voltage generating means is a transistor having the same structure as the memory cell, for outputting the test reference voltage when said driving means applies a select signal to a control gate of said test reference voltage generating means.

28. The non-volatile semiconductor memory device of claim 27, wherein said driving means is a decoder for outputting the select signal in response to a test signal.

29. The non-volatile semiconductor memory device of claim 26, wherein said test reference voltage generating means is a transistor having a source, a drain and a control gate; and said driving means applies a select signal to the control gate of said test reference voltage generating means, the drain of said test reference voltage generating means being connected to a dummy column line.

30. The non-volatile semiconductor memory device of claim 27, wherein the transistor of said test reference voltage generating means is formed in the vicinity of and as a part of said memory cell array.

31. The non-volatile semiconductor memory device of claim 2, which further comprises a plurality of switching means interposed between the respective column lines and the common column line in such a way that any number of said switching means are selectively turned on.

32. The non-volatile semiconductor memory device of claim 31, wherein said switching means are turned on or off by a column decoder.

33. The non-volatile semiconductor memory device of claim 31, wherein said switching means are turned on one by one to selectively connect one of the column lines to the common column line for discrimination of the respective column lines individually by said differential sense amplified.

34. The non-volatile semiconductor memory device of claim 1, wherein said test means includes test reference voltage generating means for generating the test reference voltage and driving means for activating said test reference voltage generating means.

35. The non-volatile semiconductor memory device of claim 34, wherein said test voltage generating means is a transistor having the same structure as the memory cell, for outputting the test reference voltage when said driving means applies a select signal to a control gate of said test reference voltage generating means.

36. The non-volatile semiconductor memory device of claim 35, wherein said driving means is a decoder for outputting the select signal in response to a test signal.

37. The non-volatile semiconductor memory device of claim 36, which further comprises a plurality of switching means interposed between the respective column lines and the common column line in such a way that any number of said switching means are selectively turned on.

38. The non-volatile semiconductor memory device of claim 35, wherein the transistor of said test reference voltage generating means is formed in the vicinity of and as a part of said memory cell array.

39. The non-volatile semiconductor memory device of claim 38, which further comprises a plurality of switching means interposed between the respective column lines and the common column line in such a way that any number of said switching means are selectively turned on.

40. The non-volatile semiconductor memory device of claim 35, which further comprises a plurality of switching means interposed between the respective column lines and the common column line in such a way that any number of said switching means are selectively turned on.

41. The non-volatile semiconductor memory device of claim 40, wherein said switching means are turned on or off by a column decoder.

42. The non-volatile semiconductor memory device of claim 40, wherein said switching means are turned on one by one to selectively connect one of the column lines to the common column line for discrimination of the respective column lines individually by said differential sense amplifier.

43. The non-volatile semiconductor memory device of claim 34, wherein said test reference voltage generating means is a transistor having a source, a drain and a control gate; and said driving means applies a select signal to the control gate of said test reference voltage generating means, the drain of said test reference voltage generating means being connected to a dummy column line.

44. The non-volatile semiconductor memory device of claim 43, wherein the transistor of said test reference voltage generating means is formed externally from and irrespective of said memory cell array.

45. The non-volatile semiconductor memory device of claim 44, which further comprises a plurality of switching means interposed between the respective column lines and the common column line in such a way that any number of said switching means are selectively turned on.

46. The non-volatile semiconductor memory device of claim 43, which further comprises a plurality of switching means interposed between the respective column lines and the common column line in such a way that any number of said switching means are selectively turned on.

47. The non-volatile semiconductor memory device of claim 46, wherein said switching means are turned on or off by a column decoder.

48. The non-volatile semiconductor memory device of claim 46, wherein said switching means are turned on one by one to selectively connect one of the column lines to the common column line for discrimination of the respective column lines individually by said differential sense amplifier.

49. The non-volatile semiconductor memory device of claim 34, which further comprises a plurality of switching means interposed between the respective column lines and the common column line in such a way that any number of said switching means are selectively turned on.

50. The non-volatile semiconductor memory device of claim 49, wherein said switching means are turned on or off by a column decoder.

51. The non-volatile semiconductor memory device of claim 49, wherein said switching means are turned on one by one to selectively connect one of the column lines to the common column line for discrimination of the respective column lines individually by said differential sense amplifier.

* * * * *